(12) United States Patent
Doyle et al.

(10) Patent No.: US 10,541,014 B2
(45) Date of Patent: Jan. 21, 2020

(54) MEMORY CELLS WITH ENHANCED TUNNELING MAGNETORESISTANCE RATIO, MEMORY DEVICES AND SYSTEMS INCLUDING THE SAME

(71) Applicants: Brian S. Doyle, Portland, OR (US); Elijah V. Karpov, Portland, OR (US); Kaan Oguz, Portland, OR (US); Kevin P. O'Brien, Portland, OR (US); Charles C. Kuo, Hillsboro, OR (US); Mark L. Doczy, Beaverton, OR (US); Uday Shah, Portland, OR (US); Yih Wang, Portland, OR (US)

(72) Inventors: Brian S. Doyle, Portland, OR (US); Elijah V. Karpov, Portland, OR (US); Kaan Oguz, Portland, OR (US); Kevin P. O'Brien, Portland, OR (US); Charles C. Kuo, Hillsboro, OR (US); Mark L. Doczy, Beaverton, OR (US); Uday Shah, Portland, OR (US); Yih Wang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/779,029

(22) PCT Filed: Dec. 24, 2015

(86) PCT No.: PCT/US2015/000421
§ 371 (c)(1),
(2) Date: May 24, 2018

(87) PCT Pub. No.: WO2017/111851
PCT Pub. Date: Jun. 29, 2017

(65) Prior Publication Data
US 2018/0350418 A1    Dec. 6, 2018

(51) Int. Cl.
*G11C 11/16* (2006.01)
*H01L 43/08* (2006.01)
(Continued)

(52) U.S. Cl.
CPC ........ *G11C 11/161* (2013.01); *G11C 11/1659* (2013.01); *G11C 11/1673* (2013.01);
(Continued)

(58) Field of Classification Search
CPC .............. G11C 11/161; G11C 11/1659; G11C 11/1673; G11C 11/1675; G11C 11/5607;
(Continued)

(56) References Cited

U.S. PATENT DOCUMENTS 8,704,319 B2 *  4/2014  Tang ....................... H01L 43/08
                                                          257/421
9,478,730 B2 * 10/2016  Chepulskyy .......... G11C 11/161
(Continued)

FOREIGN PATENT DOCUMENTS

JP    2010067942 A    3/2010
JP    2010079974 A    4/2010

OTHER PUBLICATIONS

International Search Report received in PCT Application No. PCT/US2015/000421, dated Sep. 23, 2016, 13 pages.
(Continued)

*Primary Examiner* — Gene N Auduong
(74) *Attorney, Agent, or Firm* — Grossman, Tucker, Perreault & Pfleger, PLLC

(57) ABSTRACT

Memory cells with improved tunneling magnetoresistance ratio (TMR) are disclosed. In some embodiments such devices may include a magnetoresistive tunnel junction (MTJ) element coupled in series with a tunneling magnetoresistance enhancement element (TMRE). The MTJ element and TMRE may each be configured to transition
(Continued)

between high and low resistance states, e.g., in response to a voltage. In some embodiments, the MTJ and TMRE are configure such that when a read voltage is applied to the cell while the MTJ is in its low resistance state the TMRE is driven to is low resistance state, and when such voltage is applied while the MTJ is in its high resistance state, the TMRE remains in its high resistance state. Devices and systems including such memory cells are also disclosed.

21 Claims, 9 Drawing Sheets

(51) Int. Cl.
  *G11C 11/56* (2006.01)
  *H01L 27/22* (2006.01)
(52) U.S. Cl.
  CPC ...... *G11C 11/1675* (2013.01); *G11C 11/5607* (2013.01); *H01L 27/228* (2013.01); *H01L 43/08* (2013.01); *G11C 2211/5615* (2013.01)
(58) Field of Classification Search
  CPC .......... G11C 2211/5615; H01L 27/228; H01L 43/08
  See application file for complete search history.

(56) References Cited

U.S. PATENT DOCUMENTS

| | | | |
|---|---|---|---|
| 2007/0030724 A1* | 2/2007 | Hosomi | G11C 11/16 365/158 |
| 2009/0147392 A1* | 6/2009 | Prejbeanu | G11C 11/16 360/59 |
| 2010/0073827 A1 | 3/2010 | Zhao et al. | |
| 2014/0308760 A1 | 10/2014 | Doyle et al. | |
| 2015/0078072 A1 | 3/2015 | Abedifard | |
| 2017/0331031 A1* | 11/2017 | Bak | H01L 21/768 |

OTHER PUBLICATIONS

International Preliminary Report of Patentability received in PCT Application No. PCT/US2015/000421, dated Jun. 26, 2018, 11 pages.
Dorrance, "Modeling and Design of STT-MRAMs", University of California, Los Angeles, 2011, 76 pages.

* cited by examiner

MEMORY CELLS WITH ENHANCED TUNNELING MAGNETORESISTANCE RATIO, MEMORY DEVICES AND SYSTEMS INCLUDING THE SAME

CROSS-REFERENCE TO RELATED APPLICATIONS

This present application is a National Phase Application Filed Under 35 U.S.C. 371 claiming priority to PCT/US2015/000421 filed Dec. 24, 2015, the entire disclosure of which is incorporated herein by reference.

FIELD

The present disclosure generally relates to memory cells with enhanced tunneling magnetoresistance (TMR) ratio. Memory devices and systems including such cells are also described.

BACKGROUND

For the past several decades feature scaling has been a driving force in the production of integrated circuits in the semiconductor industry. Scaling features to smaller and smaller size can enable the production of devices that include a larger number of functional units within the limited real estate of a semiconductor chip. For example, shrinking component size may allow for an increased number of memory cells to be placed within a given area of a semiconductor chip, leading to the production of memory devices with increased storage capacity. However, shrinking feature size can also lead to challenges that in some instances can be difficult to address.

With the foregoing in mind, memory devices that include magnetic tunnel junctions (MTJs) are gaining increased attention due to their potential for replacing conventional memory. Such memory devices may include an array of memory cells that include one or more MTJs that have multiple operational states, which may be leveraged to store information. Such MTJs generally include a plurality of layers (e.g., a fixed magnetic layer, a dielectric (tunneling) layer, and a free magnetic layer), which collectively determine the magnetic behavior of the device.

Spin transfer torque memory (STTM) is one type memory that is becoming of increasing interest in the semiconductor industry, due to the relatively small size of its elements, its potential for low power operation, and its potential for direct integration with other elements on a semiconductor chip, such as transistors. Generally, the operation of STTM devices is predicated on the phenomenon of spin transfer torque. When a current is passed through a magnetization layer of such devices, called the fixed magnetic layer, the current will come out spin polarized. With the passing of each electron in the current through the fixed magnetic layer, the resulting spin (angular momentum) may be transferred to the magnetization of another magnetic layer in the device, called the free magnetic layer, resulting in a small change in the magnetization of the free magnetic layer. In effect, this is a torque which causes precession of the magnetization of the free magnetic layer. Likewise, a torque may be applied to an associated fixed magnetic layer, e.g., due to the reflection of electrons.

Ultimately when an applied current (e.g., a pulse) exceeds a threshold value (which may be defined at least in part by damping caused by the magnetic material and its environment) the orientation of the magnetization of the free magnetic layer may be switched between a state that is parallel with the orientation of the magnetization of the fixed magnetic layer, and a state that is antiparallel with the orientation of the magnetization of the fixed magnetic layer. The orientation of the magnetization of the fixed magnetic layer may remain unchanged by the applied current, e.g., because the applied current is below a threshold for the fixed magnetic layer and/or because the orientation of the magnetization of the fixed magnetic layer may be "pinned" by one or more adjacent layers, such as a synthetic antiferromagnetic layer. Spin transfer torque can therefore be used to flip the active elements in a random access memory, such as an STTM device.

The electrical resistance of an MTJ such as an STTM element may be impacted by the orientation of the magnetization of the free magnetic layer relative to the orientation of the magnetization of the fixed magnetic layer. For example the electrical resistance of some MTJ elements such as STTM elements may be relatively low when the orientation of magnetization of the free magnetic layer is parallel to the orientation of magnetization of the fixed magnetic layer. In contrast, the electrical resistance of such devices may be relatively high when the orientation of the magnetization of the free magnetic layer is antiparallel with the orientation of the magnetization of the fixed magnetic layer. MTJs such as STTM elements may therefore exhibit a tunneling magnetoresistance ratio (TMR) that is defined at least in part by the difference between the high and low resistance states of the MTJ.

While previously developed STTM and other MTJ based memory devices have proven useful, challenges have arisen as such devices have been scaled to smaller and smaller dimensions. For example it has been observed that as the size of MTJ elements in a memory device decreases, the TMR of such elements tends to decrease as well, potentially leading to performance problems. For example, as the TMR of such devices is reduced, the magnitude of the difference of between a sensed current during a read operation when the MTJ is in its low resistance and its high resistance state may also be reduced, potentially making such elements unsuitable for use in certain memory applications. In that regard various efforts have been made to mitigate the reduction in TMR that may result from the scaling of magnetic tunnel junctions. Pursuant to such efforts, it has been determined reduction in the TMR of an MTJ may be mitigated by optimizing the free, fixed, and/or dielectric layer(s) thereof. Although effective to some extent, such optimizations are inherently limited by various factors. Other options for improving the TMR of MTJ based memory elements/devices are therefore of interest.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

DETAILED DESCRIPTION

Figure 1A:
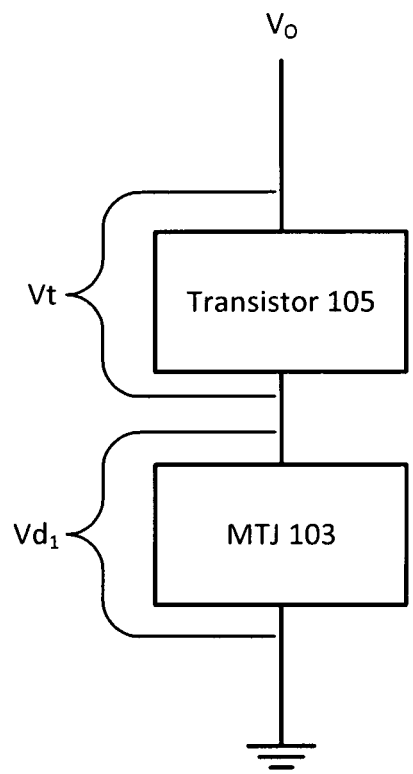
FIG. 1A is a block diagram of one example of a memory cell having a including a transistor and a magnetic tunnel junction (MTJ) element, i.e., a 1T-1MTJ memory cell.

As used herein the term "on" means that one element (e.g., a first layer) is located above another element (e.g., a second layer), but does not require the first element to be in contact with the second element. Rather it should be understood that the term "on," when used in the context of the positional relationship of two elements, means that a first element is formed above a second element, but that other (e.g., third) elements may be present between the first and second elements. In contrast, the term "directly on" is used herein to denote that a first element is in contact with a surface (e.g., an upper surface) of another element, with no intervening elements there between.

The terms, "first," "second," "third," and the like are used herein to distinguish between similar elements, and not necessarily for describing a particular sequential or chronological order. It should be understood that such terms may be interchangeably used in appropriate circumstances, such that the aspects of the present disclosure may be operable in an order other than which is explicitly described.

As used herein the terms "substantially" and "about" when used in connection with a value or range of values mean plus or minus 5% of the denoted value or the end points of the denoted range.

As briefly explained in the background, memory devices that include magnetic tunnel junctions (MTJs) are becoming of increasing interest for a variety of reasons. However as such devices are scaled to smaller and smaller dimensions, the tunneling magnetoresistance (TMR) of the memory cells thereof (and, more particularly, the MTJ elements therein) may also decrease, which can potentially lead to undesirable performance of the device and/or the memory cells thereof. With this in mind, efforts have been undertaken to mitigate the impact of scaling on TMR, e.g., through the optimization of one or more layers of a material stack that make up an MTJ. While such efforts have had some success, the degree to which optimization of the material stack of an MTJ can mitigate the impact of scaling on the TMR of an MTJ is limited by various factors. Such optimizations may therefore be insufficient to obtain memory cells with a desired TMR in certain instances.

With the foregoing in mind one aspect of the present disclosure relates to memory cells which may be useful in various types of memory devices, including resistive random access memory, magneto-resistive random access memory, spin transfer torque memory, and the like. As will be described in detail below, the memory cells of the present disclosure may include a magnetic tunnel junction element (MTJ) that is coupled to a tunneling magnetoresistance enhancement element (hereinafter, "TMRE").

The MTJ element(s) included in the memory cells described herein may be any type of MTJ that is suitable for storing information in a non-volatile manner. For the sake of clarity and ease of understanding, the present disclosure will focus on embodiments in which the MTJ element is in the form of a spin transfer torque memory (STTM) element, and in particular on a perpendicular STTM element. It should be understood that such discussions are for the sake of example only, and that any suitable MTJ element may be used. For example, the MTJs described herein may be in the form of a horizontal (i.e., in plane) STTM element or another type of MTJ structure.

Regardless of their form, the MTJs described herein may be switchable between a high resistance state and a low resistance state (and vice versa), e.g., in response to an applied voltage (e.g., a write voltage) that is greater than or equal to a first threshold, which may be referred to herein as $V_{TH1}$. The MTJ elements may also be non-volatile, in that they may be configured to remain in their high or low resistance state in the absence of an applied voltage that is greater than or equal to $V_{TH1}$. It may therefore be appreciated that in various embodiments, the MTJ elements described herein may be leveraged to store binary information (e.g., in the form of a logical 1 or a logical 0) based on their high or low resistance state.

As will be appreciated by those of skill in the art, the MTJ elements described herein will exhibit an intrinsic TMR that is defined at least in part by the difference in the resistance of the MTJ element in its high and low resistance states. More specifically, the TMR of a MTJ element consistent with the present disclosure may be defined by expression (I) below:

$$TMR_I = (R_{H1} - R_{L1})/R_{L1} \qquad (I)$$

Where $TMR_I$ is the intrinsic tunneling magnetoresistance ratio of the MTJ in question, $R_{H1}$ is the electrical resistance of the MTJ in its high resistance state, and $R_{L1}$ is the electrical resistance of the MTJ in is low resistance state.

$TMR_I$ may vary considerably depending on the configuration and the use model of the MTJ in question. For example in some embodiments such as level 2 cache, $TMR_I$ may range from greater than 10 to about 200. For others, such as Internet of things, where read speed is less important, the TMR can drop below 100. Of course such values and ranges are enumerated for the sake of example only, and the MTJ's described herein may exhibit any suitable TMR.

As noted above, the memory cells of the present disclosure include one or more TMREs that are coupled in series with an MTJ element. In general, the TMRE(s) described herein function to enhance the TMR of a memory cell above the intrinsic TMR of an MTJ of that cell, i.e., above $TMR_I$. Put in other terms, use of the TMRE may enable a memory cell to exhibit an enhanced TMR, i.e., $TMR_C$, wherein $TMR_C$ is greater than $TMR_I$.

In various embodiments the TMRE(s) of the present disclosure may be in the form of a variable resistor that, like the MTJ, is switchable between a high and low resistance state (or vice versa) in response to the application of a voltage. In some instances, the TMREs described herein may be configured such that they may transition from a default (e.g. high resistance) state to a switched (e.g., low resistance) state in response to application of a voltage that is greater than or equal to a first threshold switching voltage, $V_{TH2}$. Once it is in the low resistance state, the TMRE may remain in that state until the applied voltage falls to or below a second threshold switching voltage, $V_H$ (V hold), which is less than $V_{TH2}$. It may therefore be understood that the TMREs of the present disclosure may exhibit the same or similar switching properties as a "selector," such as a selector that may be used in previously developed memory one MTJ, one selector (1M-1S) memory cells. Unlike a selector in a 1M-1S cell however, the TMREs described herein do not function to select a memory cell (among an array of memory cells) for use in a read or write operation. Rather, the TMREs of the present disclosure function to enhance the TMR of a memory cell above the intrinsic TMR of an MTJ in that cell. Selection of a memory cell (e.g., from an array of memory cells) may be accomplished using an access transistor or some other suitable mechanism that does not rely on the TMRE.

Figure 5:
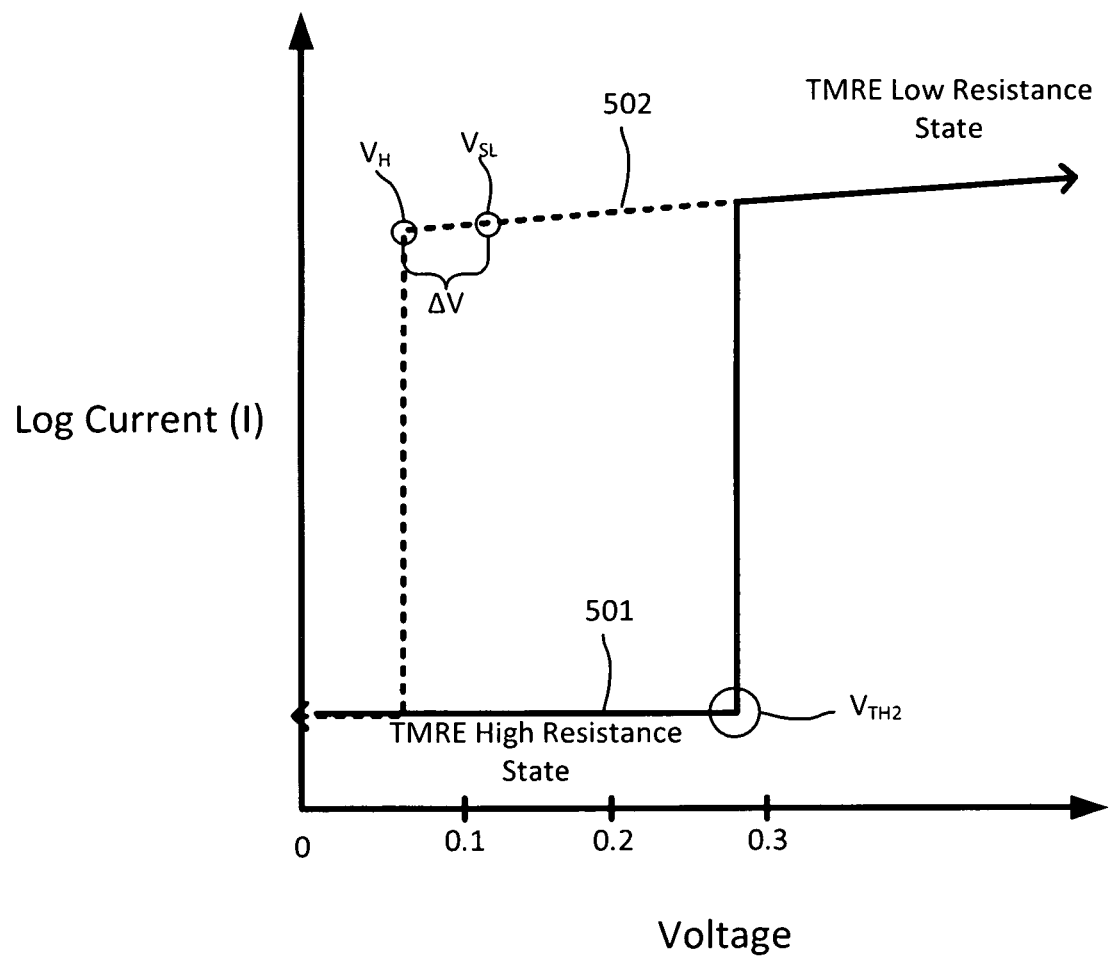
FIG. 5 is a plot of log current vs voltage for a TMRE consistent with embodiments of the present disclosure

With the foregoing in mind, the TMREs described herein in some embodiments may function as a variable resistor that may be switched from a default (e.g., high resistance) state to a switched (e.g., low resistance) state by the application of a voltage that is greater than or equal to $V_{TH2}$. Unlike the MTJ however, the TMRE may be unable to maintain its switched state in the absence of an applied voltage. For example and with reference to FIG. 5, in some embodiments at 0 volts TMRE's described herein may be in a default high resistance state. When a voltage is applied to the TMRE, the voltage may initially ramp along line 501 until it is greater than or equal to $V_{TH2}$. At that time, the TMRE may transition from its default high resistance state to its low resistance state. This is reflected by the sharp increase in line 501 when the applied voltage equals or exceeds $V_{TH2}$. At this point the TMRE may remain in its low resistance state so long as the voltage applied to it does not fall below its second threshold switching voltage, $V_H$ This concept is shown in FIG. 5 by line 502. As shown, once the TMRE is in its low resistance state, it may remain there so long as the applied voltage exceeds $V_H$. When the voltage falls to or below $V_H$ however, the TMRE may transition from its switched (low resistance) state to its default high resistance state, as shown in FIG. 5.

In some embodiments when the TMRE transitions from is default (high resistance) state to its switched (low resistance) state, the voltage applied to the TMRE may drop below $V_{TH2}$ due to the change in the electrical resistance in the TMRE. For example and as shown in FIG. 5, in some embodiments when a voltage meeting or exceeding $V_{TH2}$ is applied to the TMRE, the TMRE may transition to a low resistance state, at which time the voltage applied to the TMRE may fall to a voltage $V_{SL}$, wherein $V_{SL}$ is less than $V_H$.

With this in mind, the TMREs of the present disclosure are configured such that $V_{SL}$ is greater than $V_H$ if such a voltage drop is experienced when a voltage greater than or equal to $V_{TH2}$ is applied. Indeed as may be appreciated, if $V_{SL}$ was below $V_H$, the TMREs of the present disclosure would not stably remain in their switched (e.g., low resistance) state upon application of a voltage greater than or equal to $V_H$. Rather in such instances, a TMRE would oscillate between high and low resistance states upon the application of a voltage greater than or equal to $V_{TH2}$, which may be undesirable. In that regard, $V_{SL}$ may be understood as a low stable voltage, at or above which the TMRE may stably remain in its low resistance state.

In that regard it is noted that $V_{SL}$ may be impacted by the relative difference between the electrical resistances of a TMRE in its high and low resistance states. For example in some instances $V_{SL}$ may be reduced as the difference between the high and low resistance states of a TMRE is increased. Therefore if the difference between such states becomes too great, $V_{SL}$ may approach or even fall below $V_H$. With that in mind, as $V_{SL}$ approaches $V_H$ it may become practically difficult to maintain an applied voltage that consistently falls above $V_H$. Indeed in instances where $V_{SL}$ is close to $V_H$, variation in the voltage applied to a TMRE (e.g., due to jitter or other factors) may cause the applied voltage to temporarily fall below $V_H$, which may cause performance problems.

It may therefore be desirable to configure a TMRE such that it exhibits a desired $V_{SL}$. This may be accomplished, for example, by configuring the TMRE such that the relative difference between resistance of its high and low resistance states is not too great. For example, in some embodiments the TMREs of the present disclosure may exhibit a difference between their high resistance and low resistance states of about 5000 ohms, about 10,000 Ohms, or even about 20,000 Ohms. Moreover in some instances it may be desirable to configure the TMRE such that a suitable operating window ($\Delta V$) exists between $V_{SL}$ and $V_H$, as shown in FIG. 5. In that regard, in some embodiments the TMREs described herein may be configured such that $\Delta V$ ranges from greater than 0 to about 500 millivolts, such as from greater than or equal to about 10 to about 250 millivolts, or even greater than or equal to about 20 to about 120 millivolts. Without limitation, in some embodiments $\Delta V$ is greater than or equal to about 20 millivolts, such as greater than or equal to about 40 millivolts.

With the foregoing in mind in various embodiments the memory cells described herein include an MTJ element that is coupled in series with at least one TMRE. In operation, a voltage $V_0$ (e.g., a read or write voltage) may be applied across the memory cell, e.g., between a first contact (e.g., a bit line) and a second contact (e.g. a source line) of a memory device, wherein the first and second contacts are coupled to a transistor, the MTJ and the TMRE, respectively (or vice versa). As a result, a voltage drop Vt across the transistor, a first voltage drop Vd1 across the MTJ, and second voltage drops Vd2 across the TMRE may be observed, wherein $V_0 = Vt + Vd1 + Vd2$.

As noted above the memory cells described herein include a transistor (also referred to herein as an access transistor) that is coupled in series with the MTJ or the TMR. Generally, the access transistor functions to enable selection of a memory cell from an array of memory cells.

As noted above, when $V_0$ is applied to the cells described herein, a first voltage drop Vd1 may occur across the MTJ, whereas a second voltage drop Vd2 may occur across the TMRE. As will be understood by one of ordinary skill in the art, the value of Vd1 and Vd2 will depend on various factors such as the magnitude and polarization of $V_0$, as well as the resistance state of the MTJ element and/or the TMRE.

In instances where Vd1 is greater than or equal to $V_{TH1}$ (e.g., when a write voltage is applied to the cell), the MTJ elements described herein may be driven from a first (e.g., high resistance) state to a second (e.g., low resistance) state or vice versa. In such instances the magnitude of Vd1 (or, more particularly, $V_0$) and the high and low resistances of the MTJ (i.e., $R_{H1}$ and $R_{L1}$) may be set such that Vd2 (e.g., following voltage drops Vd1 and Vt) will always exceed the first switching voltage ($V_{TH2}$) of the TMRE. Therefore in various embodiments, the TMRE may be configured such that it is always in its switched (e.g., low resistance) state when a write voltage is applied to a cell.

Conversely when Vd1 is less than or equal to $V_{TH1}$ (e.g., when a read voltage is applied to the cell), the MTJ may remain in its current (e.g., high or low resistance state).

Moreover, the magnitude of Vd1 (or, more particularly, $V_O$) and the high and low resistances of the MTJ (i.e., $R_{H1}$ and $R_{L1}$) may be set such that in some embodiments Vd2 will be greater than or equal to $V_{TH2}$ when the MTJ is in its low resistance state, and Vd2 will be less than or equal to $V_{TH2}$ when the MTJ is in its high resistance state. In such instances, the TMRE may be configured such that when a read voltage is applied to the cell while the MTJ is in its low resistance state, Vd2 exceeds $V_{TH2}$ and the TMRE is driven from its default (e.g., high resistance) state to its switched (e.g., low resistance state). Conversely, when a read voltage is applied to the cell while the MTJ is in its high resistance state, Vd2 may be less than $V_{TH2}$ and the TMRE may remain in its default (e.g., high resistance) state.

Put in other terms, in some embodiments the MTJ and TMRE may be configured such that they are always in the same resistance state when a read voltage is applied to the cell. That is, during a read operation when the MTJ is in its high resistance state, the TMRE will be in its high resistance state, and when the MTJ is in its low resistance state, the TMRE will be in its low resistance state. As will be described in detail below, this configuration can result in the memory cell exhibiting a collectively TMR ($TMR_C$) that is greater than the intrinsic TMR ($TMR_I$) of the MTJ alone.

As noted previously the MTJ and the TMRE are coupled in series. It may therefore be appreciated that the collective resistance of a memory cell including such elements will be dominated by the sum of the resistance of the MTJ and the resistance of the TMRE. With that in mind and as will be described in detail below, the TMRE may be configured such that in its low resistance state, it exhibits an electrical resistance ($R_{L2}$) that is relatively small, e.g., about the same as or less than the electrical resistance ($R_{L1}$) of the MTJ in its low resistance state. However, the TMRE may also be configured such that in its high resistance state, it exhibits an electrical resistance ($R_{H2}$) that is relatively high, e.g., the same as or greater than the electrical resistance ($R_{H1}$) of the MTJ in its high resistance state.

Without limitation, in some embodiments the TMRE may be configured such that $R_{L2}$ is less (e.g., significantly less) than $R_{L1}$, and $R_{H2}$ is significantly greater than $R_{H1}$. For example in some embodiments $R_{L2}$ may be less than or equal to about 100% of $R_{L1}$, such as less than equal to about 80%, 70%, 60%, 50%, 40%, 30%, 20%, 10%, or even about 1% of $R_{L1}$. In contrast, $R_{H2}$ may range from greater than or equal to $R_{H1}$, and in some instances may be greater than or equal to about 1.5, 2, 3, 5, 10, 20, even about 100 times $R_{H1}$ (or more).

With the foregoing in mind, the MTJ's described herein may have any suitable $R_{L1}$ and $R_{H1}$ values, i.e., any suitable low and high resistance values. For example in some embodiments $R_{L1}$ may range from about 1000 to about 4000 ohms, such as from about 1500 to about 4000 ohms, or even about 2000 to about 4000 ohms. In some embodiments, $R_{L1}$ is about 3900 ohms. In such embodiments, $R_{H1}$ may range from greater than or equal to about 4000 to about 9000 ohms, such as about 5000 to about 8000 ohms, or even about 5000 to about 7000 ohms. Without limitation, in some embodiments $R_{L1}$ is about 2000 ohms or about 4000 ohms and $R_{H1}$ is about 9000 or about 8000 ohms. In some embodiments, $R_{L1}$ is about 3900 ohms and $R_{H1}$ is about 7000 ohms Similarly the TMREs described herein may have any suitable $R_{L2}$ and $R_{H2}$ values, i.e., any suitable low and high resistance values. For example in some embodiments $R_{L2}$ may range from greater than 0 to about 1000 ohms, such as from greater than 0 to about 800 ohms, from about 200 to about 800 ohms, or even from about 200 to about 700 ohms. Likewise $R_{H2}$ may range from greater than or equal to about 5000 ohms to about 50,000 or more, such as from greater than or equal to about 5000 to about 20,000 ohms, even from about 5000 to about 10,000 ohms. Without limitation, in some embodiments $R_{H2}$ ranges from about 9,000 to about 11,000 ohms, and in some case is about 10,000 ohms.

As noted previously in some embodiments $R_{L2}$ may be significantly less than $R_{L1}$, whereas $R_{H2}$ may be significantly greater than $R_{H1}$. Thus for example, in some embodiments the MTJ and TMRE may be configured such that $R_{L1}$ ranges from about 1000 to about 4000 ohms (e.g., about 3900 ohms), $R_{L2}$ ranges from greater than 0 to about 500 ohms (e.g., about 200 ohms), $R_{H1}$ ranges from about 6000 to about 8000 ohms (e.g., about 7000 ohms) and $R_{H2}$ ranges from greater than 8000 to about 15,000 ohms (e.g., about 10,000, 12,000, or even about 14,000 ohms). Without limitation in some embodiments $R_{L1}$ and $R_{L2}$ are about 3900 and about 7000 ohms, respectively, and $R_{L2}$ and $R_{H2}$ are about 200 and about 10,000 ohms, respectively.

Because the MTJ and TMRE are coupled in series with one another, it may be appreciated that the memory cells described herein may exhibit a collective low resistance (CRL) when the MTJ and TMRE are both in their low resistance state, where $CRL=R_{L1}+R_{L2}$. Moreover the memory cells described herein may exhibit a collective high resistance (CRH) when the MTJ and TMRE are both in their high resistance states, where $CRH=R_{H1}+R_{H2}$. In instances where an access transistor is included in the cell, the resistance of the access transistor may also be added to the resistance of the MTJ and TMRE in the determination of CRL and CRH. However because the resistance of the access transistor is expected to be small relative to the $R_{L1}$, $R_{H1}$, $R_{L2}$, and $R_{H2}$ when a cell is selected (i.e., when the transistor is in is closed state), the resistance of the transistor has been omitted from the above representations of CRL and CRH.

With the foregoing in mind, the memory cells described herein may exhibit collective TMR which may be determined by expression II below:

$$TMR_C=(CRH-CRL)/CRL \qquad (II)$$

where CRH and CRL are defined as set forth above, and $TMR_C$ is the tunneling magnetoresistance of a cell including an MTJ and TMRE that are coupled in series. Because $R_{L2}$ is lower than $R_{L1}$ and $R_{H2}$ is higher than $R_{H1}$, it may be understood that the difference between CRH and CRL (i.e., CRH-CRL) may be greater (indeed in some instances, significantly greater) than the difference between $R_{H1}$ and $R_{L1}$ (i.e., $R_{H1}-R_{L1}$).

The memory cells of the present disclosure may therefore exhibit a $TMR_C$ that is greater than the intrinsic TMR of the MTJ(s) therein, i.e., $TMR_I$. Indeed in some embodiments $TMR_C$ may be greater than $TMR_I$ by about by about 10, 20, 30, 50, 75, 100, 150, 200, or even 300 percent or more. Put in other terms, in some embodiment the memory cells described herein may exhibit a $TMR_C$ that ranges from about 200 to about 600 or more, such as from about 200 to about 560, or even about 250 to about 500. Put in other terms, in some embodiments $TMR_C$ may be greater than $TMR_I$, and may range from greater than or equal to about 200, such as greater than or equal to about 175, about 200, about 250, about 300, about 350, about 400, about 500, about 560, or more. Without limitation, in some embodiments $TMR_I$ may be about 40, and $TMR_C$ may be about 560, $TMR_I$ may be about 55 and $TMR_C$ may be about 470, $TMR_I$ may be about 70 and $TMR_C$ may be about 420, $TMR_I$ may be about 85 and $TMR_C$ may be about 420, and $TMR_I$ may be about 100 and $TMR_C$ (e.g., where the range of $R_{L1}$ to $R_{H1}$ is about 3500 to about 7000 ohms, and the range of $R_{L2}$ to $R_{H2}$ is about 200 to about 10,000 ohms). Of course, such values and ranges are enumerated for the sake of illustration only, and are not limiting. Indeed, memory cells that exhibit any suitable $TMR_C$ and which include an MTJ exhibiting any suitable $TMR_I$ are envisioned by the present disclosure.

In the interest of clarity and to facilitate understanding of the technologies described herein, the present disclosure will now proceed to describe the operation of various embodiments with reference to the figures. Initially, the discussion will focus on one example of a memory cell having a so called 1T-1J (i.e., one transistor, one magnetic tunnel junction) configuration, as well an example of a memory device including an array of such cells. Following that discussion various embodiments of memory cells consistent with the present disclosure will be described, as well as memory devices and systems that include an array of such cells.

Reference is therefore made to FIG. 1A, which is a block diagram of a memory cell having a so-called 1T-1J configuration. As shown, memory cell 100 includes including single magnetic tunnel junction (MTJ) 103 that is coupled to a single access transistor 105. As will be described later in conjunction with FIG. 1C, transistor 105 may function to enable selection of a single memory cell in a memory device that includes an array of memory cells 100. In contrast, MTJ 103 is configured to store binary data using a magnetic tunnel junction, as would be understood by one of ordinary skill in the art.

For the sake of illustration the present disclosure focuses on embodiments in which MTJ 103 is in the form of an STTM element that includes a substrate, one or more conductive layers, and a material stack. As will be described below, the material stack may include a fixed magnetic layer, a dielectric (tunnel oxide) layer, and a free magnetic layer on the dielectric layer. It should be understood that the STTM elements described herein are but one type of MTJ that may be used in the memory cells described herein, and that any suitable MTJ device may be used in the memory cells and devices herein.

MTJ 103 may include or be formed on any suitable type of substrate. Non-limiting examples of suitable substrates include but are not limited to dielectric layers such as those that may be found in various components of semiconductor devices (e.g., interconnect layers, bump over metallization layers, etc.) or other components in which dielectric layers may be used. Without limitation, in some embodiments the substrate may be an interlayer dielectric (ILD), e.g., which may be located in or proximate to one or more interconnects of a semiconductor device. Of course, such substrates are enumerated for the sake of example only, and other suitable types of substrates may be used and are envisioned by the present disclosure.

Regardless of the nature of the substrate, as noted above MTJ 103 may be formed on or include one or more conductive layers disposed on a substrate. For example, in some embodiments MTJ 103 may be formed on or include a conductive layer that is formed on the substrate. In any case the conductive layer may be formed by bulk deposition of conductive material on the upper surface of substrate, e.g., by physical vapor deposition, chemical vapor deposition, atomic layer deposition, electrodeposition, electroless deposition, or the like. Regardless of the manner in which they are formed, the conductive layer(s) may be formed from one or more electrically conductive materials. Non-limiting examples of conductive materials that may be used to form the conductive layer include metals such as ruthenium, iridium, rhodium, combinations and alloys thereof, and the like. Alternative or additionally, the conductive layer may be formed from or include conductive carbon based materials, e.g., graphite, graphene, and the like.

As previously noted, MTJ 103 may include a material stack. As used herein, the term "material stack" refers to a series of material layers which may make up all or a portion of the functional elements of an MTJ or, more particularly, an STTM element. With that in mind, the present disclosure will proceed to describe an example of a material stack of an STTM element which includes a single fixed magnetic layer, a dielectric (e.g., tunnel oxide) layer, and a single free magnetic layer. However, it should be understood that other layers may also be included in the material stack.

Indeed the material stack in some embodiments may include one or more additional layers, such as one or more underlayers beneath the fixed magnetic layer. Such underlayers may include, for example, pinning layers such as synthetic antiferromagnetic layers, electrical contacts such as a first contact layer, etc., combinations thereof, and the like, as would be understood by those of skill in the art. For example in some embodiments (though not shown in the FIGS.), material stack may include a first contact layer that is formed on one or more underlayers (e.g., a first contact layer on a conductive layer formed on a substrate, one or more antiferromagnetic layers on the first contact layer, etc.), a fixed magnetic layer on the underlayers, a dielectric layer on the fixed magnetic layer, and a free magnetic layer on the dielectric layer.

In some embodiments the material stack of MTJ 103 may also include one or more over layers, i.e., layers which may be formed over a free magnetic layer in MTJ 103. Such over layers may include, for example, a second contact layer (e.g., similar to the first contact layer described above), either alone or in combination with other over layers as would be understood by those of skill in the art. Likewise, it should be understood that the fixed magnetic layer, free magnetic layer, and dielectric (e.g. tunnel oxide) layer of the MTJ's described herein may each be formed of one or multiple layers. Moreover while the present disclosure describes embodiments in which transistor 105 is separate from MTJ 103, it should be understood that in some embodiments the material stack of MTJ 103 may include transistor 105.

Figure 1B:
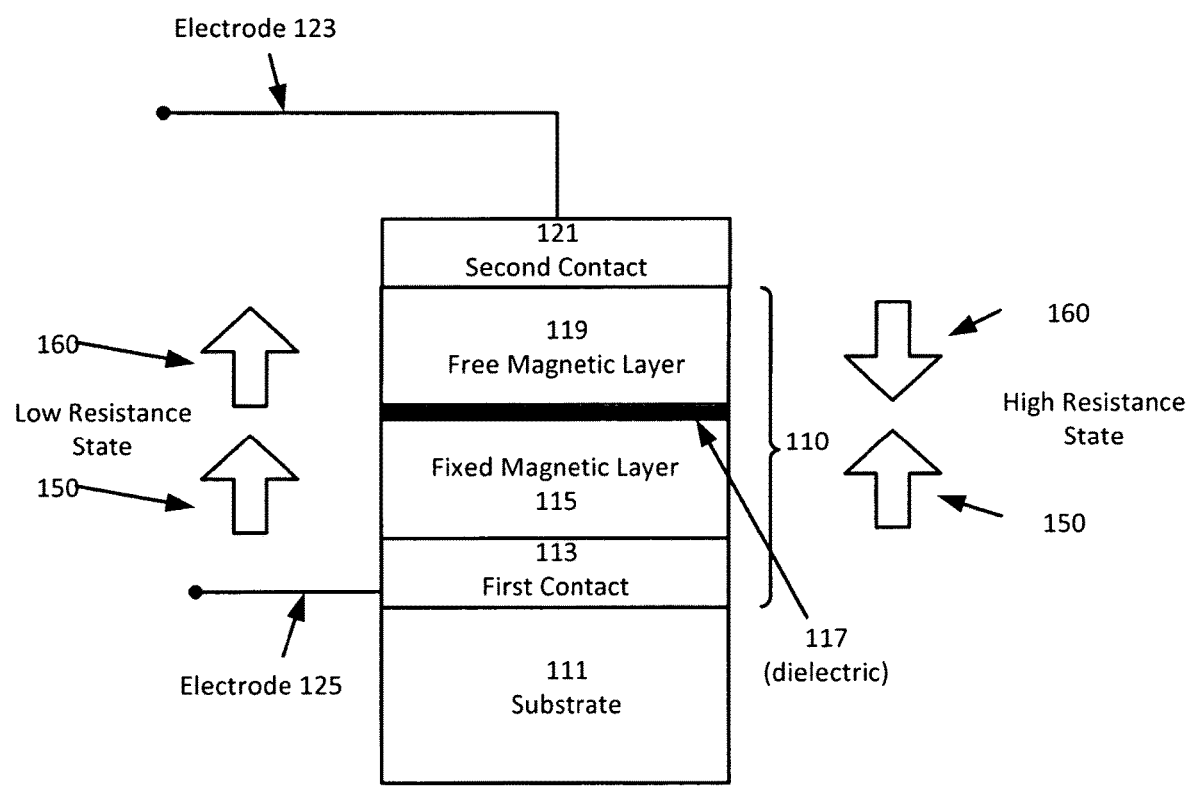
FIG. 1B is a block diagram of the layer structure of one example of an MTJ.
Figure 1C:
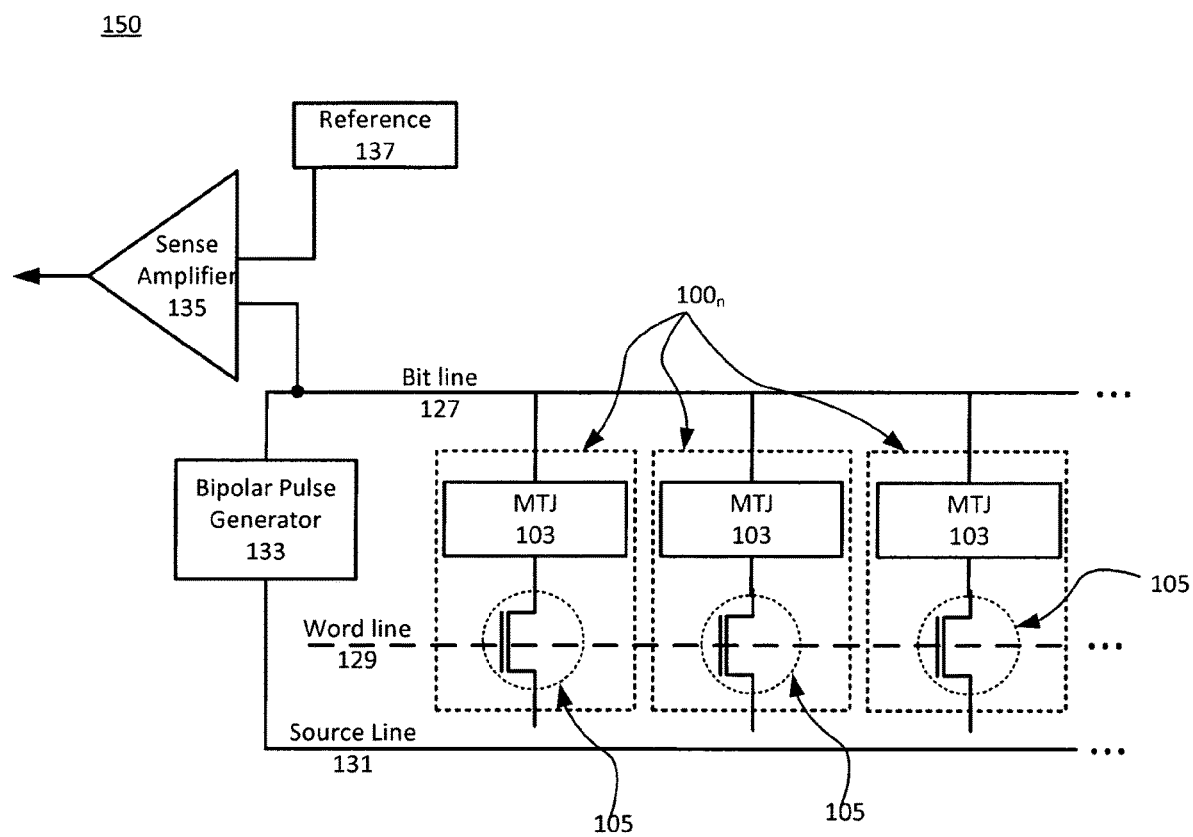
FIG. 1C is a block diagram of one example of a memory device including an array of 1T-1MTJ memory cells.

With the foregoing in mind, reference is made to FIG. 1B, which depicts one example of the layer structure of an MTJ 103 consistent with the present disclosure. As shown in the illustrated embodiment, MTJ 103 includes substrate 111 and a material stack 110 formed thereon. Material stack 110 includes a first contact 113 on substrate 111 (or a conductive layer (not shown) thereon), fixed magnetic layer 115 on first contact 113, a tunneling (dielectric) layer 117 on fixed magnetic layer 115, a free magnetic layer 119 on dielectric layer 117, and a second contact 121 on free magnetic layer 119. Generally, first and second contacts 113, 121 are conductive layers that may function to couple material stack 110 to other elements, such as a source of electric power and/or voltage.

As shown, fixed magnetic layer 115 is formed on (e.g., directly on) the upper surfaces of substrate 113 and first contact 113, but as noted previously other layers (e.g., a conductive layer, one or more underlayers, etc.) may be present between fixed magnetic layer 115 and the upper surfaces of substrate 111 and/or first contact 113. In any case, fixed magnetic layer 115 may be formed of any suitable materials that may be used as a fixed magnetic layer of an STTM element, and may include one or more than one layer as previously described. Non-limiting examples of suitable materials that may be used to form fixed magnetic layer 115 include magnetic alloys cobalt, such as but not limited to alloys of cobalt, iron, and boron (e.g., CoFeB), one or multiple alternating iron and platinum layers, one or multiple alternating cobalt (Co) and platinum (Pt) layers (Co/Pt), one or multiple alternating cobalt iron alloy (CoFe) and Pt layers (CoFe/Pt), one or multiple alternating iron platinum (FePt) alloy and Pt layers (FePt/Pt), one or multiple layers of a metal X doped with a dopant Y, where x is iron, cobalt, and/or nickel, and Y is boron, phosphorous, carbon, or silicon, one or more iron platinum (FePt) alloy layers, one or multiple alternating layers of CoFeB and a heavy metal, H, wherein H is tungsten, tantalum (Ta), molybdenum (Mo), niobium (Nb), chromium (Cr), or a combination thereof (e.g., CoFeB/J/CoFeB), and the like.

Without limitation, in some embodiments fixed magnetic layer 115 is formed from one or more layers of CoFeB. In other embodiments, fixed magnetic layer 115 is formed from a stack including a first layer of CoFeB or CoFe, a second layer of ruthenium on the first layer, and a third layer of CoFeB on the ruthenium layer. In such embodiments, fixed magnetic layer 115 may be an antiferromagnetic stack of CoFe, ruthenium, and CoFeB, wherein the thickness of the second layer (i.e., the ruthenium layer) may be very specific, e.g., ranging from about 4 to about 9 nanometers (nm). Alternatively or additionally, in some embodiments fixed magnetic layer 115 may be formed from one or more alternating layers of CoFeB and a heavy metal, H, wherein H is defined above and each heavy metal layer is about 3 to about 5 angstroms thick.

Regardless of its composition or configuration, fixed magnetic layer 115 may be formed of a material or stack of materials that are suitable for maintaining a fixed majority spin. Thus, fixed magnetic layer 115 in some embodiments may be referred to as a ferromagnetic layer. For example in some embodiments fixed magnetic layer 115 is configured to maintain a fixed majority spin that is substantially aligned with the plane of substrate 111 and/or which is perpendicular or substantially perpendicular to the plane substrate 111. Without limitation, in some embodiments material stack 110 is configured to form a perpendicular STTM element, in which case fixed magnetic layer 115 may be configured to maintain a majority spin that is perpendicular to the plane of substrate 111, e.g., as shown in FIG. 1B.

The thickness of the one or more layers within fixed magnetic layer 115 may vary considerably depending on the application and the nature of the materials used in material stack 110. For example, in some embodiments the thickness of one or more of the layer(s) in fixed magnetic layer 110 may range from about 3 angstroms to about 14 angstroms. Of course, fixed magnetic layers having any suitable thickness may be used.

Dielectric layer 117 in some embodiments is composed of a material that is suitable for allowing current of a majority spin to pass through it, while impeding at least to some extent the passage of current of a minority spin. Dielectric layer 117 may therefore be understood as a tunneling layer, and may be referred to herein as such. In some embodiments, dielectric layer 117 may be formed from one or more oxides. Non-limiting examples of oxides which may be used to form dielectric layer 117 include magnesium oxide (MgO), aluminum oxide ($Al_2O_3$), europium oxide (EuO), europium magnesium oxide (EuMgO), europium sulfide (EuS), europium selenide (EuSe), bismuth manganate ($BiMnO_3$), nickel iron oxide ($NiFe_2O_4$), cobalt iron oxide ($CoFe_2O_4$), gallium arsenide (GaAs), europium oxide (EuO), strontium titanate ($SrTiO_3$), magnesium aluminum oxide (MgAlO), combinations thereof, and the like. Of course, other suitable materials may also be used to form dielectric layer 117. Without limitation, in some embodiments dielectric layer 117 is formed from MgO.

The thickness of dielectric layer 117 may vary considerably depending on the application and the nature of the materials used in material stack 110. For example, in some embodiments the thickness of dielectric layer 117 may range from about 6 angstroms to about 12 angstroms. As may be appreciated, the thickness of dielectric layer 117 may impact its resistance area product (RA), as measured in ohm micron squared ($\Omega\mu^2$). It may therefore be desirable to control the thickness of dielectric layer 205 to achieve a desired RA, such as from about 1 to about 20 $\Omega\mu^2$.

Material stack 110 may be generally configured to provide a planar or a perpendicular STTM element. Depending on the desired configuration, the configuration of fixed magnetic layer 115 and free magnetic layer 119 may be altered. Without limitation, in some embodiments material stack 110 is configured to provide a perpendicular STTM element. In that regard free magnetic layer 119 may be configured such that a perpendicular component of the magnetic orientation dominates over an in-plane component of the magnetic orientation of the layer. For example, when free magnetic layer 119 is or includes one or more layers of CoFeB alloy, the perpendicular component of magnetization obtained from the iron of the layer interacting with oxygen in dielectric layer 117 (e.g., MgO) may dominate over the horizontal component of magnetization in free magnetic layer 119. In such instances, it may be appreciated that the degree of oxidation of surface (e.g., Fe) atoms in free magnetic layer 119 at the interface with dielectric (MgO) layer 117 may cause free magnetic layer 119 to have perpendicular-dominated spin states.

As noted, in some embodiments one or more layers of a CoFeB alloy may be used to form free magnetic layer 119. Although CoFeB may be particularly suitable in some applications, it should be understood that other materials may be used to form free magnetic layer 119. For example, free magnetic layer 119 may be formed from one or more layers of magnetic alloys of cobalt, such as but not limited to alloys of cobalt, iron, and boron (e.g., CoFeB), one or multiple alternating iron and platinum layers, one or multiple alternating cobalt (Co) and platinum (Pt) layers (Co/Pt), one or multiple alternating cobalt iron alloy (CoFe) and Pt layers (CoFe/Pt), one or multiple alternating iron platinum (FePt) alloy and Pt layers (FePt/Pt), one or multiple layers of a metal X doped with a dopant Y, where x is iron, cobalt, and/or nickel, and Y is boron, phosphorous, carbon, or silicon, one or more iron platinum (FePt) alloy layers, one or multiple alternating layers of CoFeB and a heavy metal, H, wherein H is defined above, or a combination thereof (e.g., (e.g., CoFeB/H/CoFeB), combinations thereof, and the like.

The thickness of the one or more layers within free magnetic layer 119 may also vary considerably depending on the application and the nature of the materials used in material stack 110. For example, in some embodiments the thickness of one or more of the layer(s) in free magnetic layer 119 may range from about 3 angstroms to about 14 angstroms.

As noted above fixed magnetic layer 115 may have a magnetic orientation that is pinned in a direction that is perpendicular to the plane of substrate 111. This concept is shown in FIG. 1B, wherein the orientation 150 of the magnetization of fixed magnetic layer 115 is shown with an arrow directed perpendicular to the plane of substrate 111. As previously explained and as would be understood by those of skill in the art of STTM devices, free magnetic layer 119 may have an orientation 160 of magnetization that may be also be perpendicular to the plane of substrate 111, but which may be aligned parallel or antiparallel with the orientation of magnetization 150 of fixed magnetic layer 115. This concept is also illustrated in FIG. 1B, which depicts orientation 160 of the magnetization of free magnetic layer 119 as being parallel or anti-parallel with orientation 150 of the magnetization of fixed magnetic layer 115. As further shown, when orientation 160 is aligned parallel with orientation 150, MTJ 103 may be in a low resistance state, i.e., a state in which electrons may tunnel relatively easily through dielectric layer 117. In contrast when orientation 160 is antiparallel with orientation 150, MTJ 103 may be in a high resistance state, i.e., a state in which it is relatively more difficult for electrons to tunnel through dielectric layer 117.

Consistent with the previous description material stack 110 may include additional layers above and/or below free magnetic layer 119, fixed magnetic layer 115, or both. For example, in some embodiments a first contact (electrode) 113, e.g., of tantalum, is formed as a layer below fixed magnetic layer 115, and a second contact (electrode) 121, e.g., of tantalum, is formed as a layer above free magnetic layer 119. Alternatively or additionally, in some embodiments a synthetic antiferromagnetic layer is formed below fixed magnetic layer 115.

As further shown in FIG. 1B, in some embodiments a first electrode 123 (e.g. a first trace) may be used to couple free magnetic layer 119 to another component such as a voltage source, e.g., directly or through first contact 121. Similarly, a second electrode 125 (e.g., a second trace) may be used to couple fixed magnetic layer 115 to another component such as a transistor, a source of voltage, combinations thereof, and the like, e.g., directly or through first contact 113. Via first and second electrodes 123, 125, a voltage may be applied to MTJ 103, causing orientation 160 to switch from a direction that is parallel with orientation 150 to a direction that is anti-parallel with orientation 150, or vice versa. Put in other terms, material stack 110 may be configured such that when a voltage that is greater than or equal to a first threshold voltage ($V_{TH1}$) is applied across MTJ 103, the orientation 160 of free magnetic layer 119 is changed, e.g., from a state that is parallel with orientation 150 to a state that is anti-parallel with orientation 150, or vice versa.

It is noted that FIG. 1B (and later, FIG. 3) depicts an embodiment in which fixed magnetic layer is located proximate the bottom of material stack 110, and free magnetic layer 119 is located proximate the top of material stack 110. It should be understood that such illustration is for the sake of example only, and that material stack 110 may be configured in another manner. For example, in some embodiments free magnetic layer 119 may be located proximate the bottom of material stack 110 (e.g., underneath dielectric layer 117), whereas fixed magnetic layer 115 may be located proximate the top of material stack 110 (e.g., above dielectric layer 117).

Returning now to FIG. 1A, as further shown memory cell 100 includes a transistor 105 coupled to MTJ 103, such that memory cell has a 1T-1MTJ structure. The operation of memory cells having such a configuration is well understood in the art, and therefore is only briefly summarized herein. Generally, transistor 105 may function as a switch which may enable the selection of one memory cell 100 from an array of memory cells 100n. For example, transistor 105 may be coupled to a word line (not shown in FIG. 1A), which may control whether transistor 105 is in an ON or an OFF state. In its OFF state, transistor 105 may prevent the application of a voltage to cell 100. When the state of MTJ 103 is to be changed (e.g., during a write operation) or read (e.g., during a read operation), word line 111 may cause transistor 105 to transition to an ON state, thereby allowing voltage $V_O$ to be applied to cell 100.

In the case of a read operation, a read voltage $V_O$ (also referred to as $V_R$) may be applied to cell 100, wherein $V_O$ is less than $V_{TH1}$ of MTJ 103. In such instances MTJ 103 may remain in its current state. The resistance state of MTJ 103 may be determined, e.g., with sense circuitry which may sense the magnitude of a current passing through cell 100. When MTJ 103 is in its high resistance state, the sensed current may be relatively small, whereas when MTJ 103 is in its low resistance state, the sensed current may be relatively high. In the case of a write operation, a voltage $V_O$ (also referred to as $V_W$) may be applied to cell 100, wherein $V_O$ is greater than $V_{TH1}$ of MTJ 103. In such instances $V_O$ may drive MTJ 103 from its current (e.g., high or low resistance) state to a switched (e.g., low or high resistance) state. Completion of the write may be determined by sensing a change in the current flowing through the selected cell.

The foregoing concepts may be applied to produce a memory device that includes an array of memory cells 100. In that regard reference is made to FIG. 1C, which depicts one example of a memory device 150. As shown, memory device includes a plurality (e.g, an array) of memory cells $100_n$, wherein n is a positive integer greater than or equal to 2. The nature and operation of memory cells $100_n$ is the same as described above with regard to memory cell 100, and therefore is not reiterated in the interest of brevity. As further shown, memory device includes bit line 127, word line 129, source line 131 (which may also be understood as a sense line), a bipolar pulse generator 133, a sense amplifier 135, and a reference 137. Bit line 127 and source line 131 are each coupled to a plurality of memory cells $100_n$. In some embodiments bit line 127 may be coupled to a contact proximate the free magnetic layer in the MTJs of cells $100_n$, e.g., to second contact 121 of material stack 110 shown in FIG. 1B. In such instances source line 131 may be coupled to a contact proximate the fixed magnetic layer in the MTJs of cells $100_n$, e.g., to first contact 113 of material stack 110. Of course such configuration is not required, and other suitable configurations may be used.

In any case, one or more word lines 129 may be coupled to transistors 105 in each of memory cells 100n. In general, a word line 129 may be leveraged to select one memory cell 100 from the plurality of memory cells 100n, e.g., in connection with a read or a write operation. In that regard, word line(s) 129 may be coupled to other components, e.g., a memory controller, a read/write controller, or the like (not shown), which may function to control the performance of read or write operations on one or more of memory cells 100n. For example in some embodiments a memory controller may transmit or cause the transmission of a cell select signal along a word line 129, wherein the cell select signal causes one of transistors 105 to transition from an OFF to an ON state, e.g., without affecting the OFF state of the other transistors 105. In that way, one or more cells 100 of the plurality of cells 100n may be selected, e.g., in connection with a read, write, or other operation.

In the case of a read operation, the memory controller may cause bipolar pulse generator 133 to generate a pulse with a read voltage ($V_R$) that is less than the switching voltage ($V_{TH1}$) of the MTJ 103 of a selected cell. $V_R$ may be applied across selected cell 100 via bit line 127 and source line 130. During application of $V_R$, the state of the MTJ 103 of the selected cell may be determined, e.g., with sense amplifier 135. More specifically, sense amplifier 135 may sense the magnitude of a current passing through the selected cell 100 in response to $V_R$, e.g., relative to a reference point (e.g., reference current) provided by reference 137. When MTJ 103 is in its high resistance state, the sensed current may be relatively small, whereas when MTJ 103 is in its low resistance state, the sensed current may be relatively high.

As may be appreciated from the foregoing, the TMR of the selected cell 100 (or, more specifically, the MTJ 103 thereof) will directly impact the magnitude of the difference between the current that will flow through the selected cell when its MTJ is in its high resistance state and the current the current that will flow through the cell when its MTJ is in its low resistance state. That is in the embodiment of FIGS. 1A-1C, $TMR_I$ of MTJ 103 will determine the difference between a first current $I_1$ and a second current $I_2$ flowing through a selected cell during read operations, wherein $I_1$ is the current flowing the selected cell when MTJ 103 is its low resistance state, and $I_2$ is the current flowing through the selected cell with MTJ 103 is in its high resistance state. Thus, when $TMR_I$ is relatively small, the difference between $I_1$ and $I_2$ (i.e., $I_1-I_2$) will be relatively small, and when $TMR_I$ is relatively large, $I_1-I_2$ will also be relatively large.

Likewise during a write operation, the memory controller may cause bipolar pulse generator 133 to generate a pulse with a write voltage ($V_W$) that is greater than the switching voltage ($V_{TH1}$) of the MTJ 103 of a selected cell. Like $V_R$, $V_W$ may be applied across selected cell 100 via bit line 127 and source line 130. During application of $V_W$, the state of the MTJ 103 of the selected cell may be monitored, e.g., with sense amplifier 135. More specifically, sense amplifier 135 may sense the magnitude of a current passing through the selected cell 100 in response to $V_W$, e.g., relative to a reference point (e.g., reference current) provided by reference 137. Successful completion of the write may be signaled, for example, by the detection of a transition from a first current flow to a second current flow through the selected cell in response to $V_W$, i.e., a transition from $I_1$ to $I_2$ or vice versa.

As noted above efforts have been made to reduce the size of MTJ 103, e.g., so as to produce memory devices 150 with an increased number of memory cells $100_n$. It has been observed however that decreasing the scale of MTJ 103 causes a corresponding reduction in the $TMR_I$ thereof and, in turn, results in a relatively small difference in the current flowing through a selected cell when MTJ 103 is in its high resistance state, versus when it is in its low resistance state. As may be appreciated, the relatively low $TMR_I$ exhibited by cells $100_n$ may make more difficult to accurately determine the state of MTJ 103, and thus, the nature of the information stored therein (i.e., whether MTJ 103 stores a logical 1 or 0).

Figure 2:
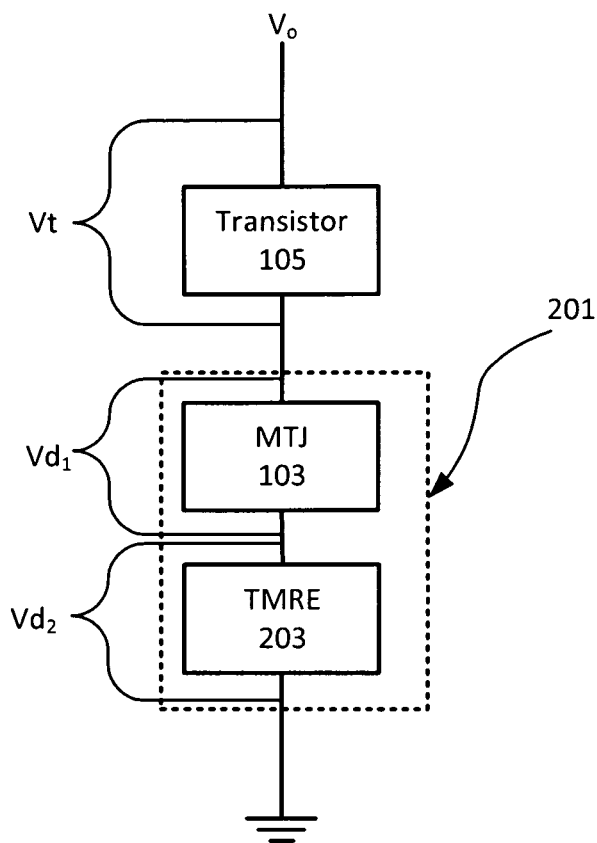
FIG. 2 is a block diagram of one example of a memory cell including a transistor, an MTJ element, and a tunneling magnetoresistance enhancement (TMRE) element, i.e., a 1T-1J-1TMRE memory cell consistent with the present disclosure.

With the foregoing in mind reference is now made to FIG. 2, which depicts one example of a memory cell consistent with the present disclosure. As shown, memory cell 200 includes many of the same elements as memory cell 100, such as MTJ 103 and transistor 105. The nature and function of such elements are the same as described above in connection with FIG. 1, and are therefore not reiterated here for the sake of brevity. In addition to such components, memory cell 200 includes TMRE 203, which is coupled in series with MTJ 103. It may therefore be understood that cell 200 has a 1 transistor, 1 MTJ, and 1 TMRE configuration (1T-1MTJ-1TMRE).

As an initial matter it is noted that the present disclosure focuses on embodiments in which TMRE 203 is coupled in series with MTJ 103, which in turn is coupled in series with transistor 105. It should be understood that such embodiments are for the sake of example only, and that TMRE 203, MTJ 103, and transistor 105 may be arranged in another manner. For example, in some embodiments MTJ 103 may be coupled in series with TMRE 203, which in turn is coupled in series with transistor 105.

As explained previously, TMRE 203 may be configured such that it functions as a variable resistor that may switch from a default (e.g., high resistance) state to a switched (e.g., low resistance) state in response to an applied voltage. In that regard TMRE 203 may include one or more switching layers, wherein each switching layer includes one or more layers of a switchable material, i.e., a material which may transition from a (relatively) insulating to a (relatively) conductive state (or vice versa) in response to a voltage, e.g., a voltage that exceeds a threshold switching voltage (i.e., $V_{TH2}$ as noted above).

Non-limiting examples of switchable materials that may be used in the switching layer(s) of TMRE 203 include chalcogenide allows such as alloys of silicon sulfide, selenide, or telluride with germanium sulfide, selenide, or telluride, in which the fraction of silicon and/or germanium may vary from greater than 0 to 100%. In some instances, such alloys may include dopants such as arsenic (As) and/or bismuth (Bi). Other non-limiting examples of switchable materials that may be used to in TMRE 203 include metal-insulator-transition (MIT) materials, such as but not limited to so-called Mott insulators. As used herein, the term "Mott insulator" refers to a subset of materials that exhibit an MIT and which are expected to be conductive under conventional band theory, but which may become resistive due to electron-electron correlations, e.g., in response to at least one of the application and withdrawal of a force such as a voltage and/or an electric field.

Non-limiting examples of suitable Mott insulators that may be used in accordance with the present disclosure include $VO_2$, metal doped $V_2O_3$, $RNiO_3$ (where R is one or more rare earth elements selected from lanthanum, cerium, praseodymium, neodymium, promethium, samarium, europium, gadolinium, terbium, dysprosium, holmium, erbium, thulium, ytterbium, lutetium, actinium, thorium, protactinium, uranium, plutonium, americium, berkelium, californium, einsteinium, fermium, mendelevium, nobelium, lawrencium, and combinations thereof), NbO2, metal doped $NbO_2$, $Fe_3O_4$, FeS, $Ti_3O_5$, $Ti_2O_3$, $LaCoO_3$, $SmNiO_3$, combinations thereof, and the like.

With the foregoing in mind, TMRE 203 may be a stand-alone device or it may be integral with MTJ 103. For example in some embodiments TMRE 203 may be a stand-alone two terminal device that is coupled in series with MTJ 103, and which includes one or more switching layers that are sandwiched between two conductive electrodes. Alternatively and as will be focused on below, in some embodiments the TMRE 203 may be integral with MTJ 103. In such instances the components of TMRE 203 (e.g., one or more switching layers thereof) may be formed on and/or with the components of MTJ 103, such that MTJ 103 and TMRE 203 are coupled in series and are part of the same monolithic structure (e.g., the same material stack). In any case, it may be useful to understand the memory cells described herein as including a transistor 105 that is coupled to a combination 201 of an MTJ 103 that is coupled in series with a TMRE 203, where TMRE 203 may be integral with or separate from MTJ 103.

In either case, TMRE 203 may include one or more additional layers other than the switching layer(s) noted above. For example, in some embodiments TMRE 203 may include one or more barrier layers which are configured to prevent intermixing between the materials of the switching layer(s) and one or more adjacent layers, e.g., one or more metal layers. Such barrier layers may, for example, be formed under and/or on the switching layer(s) thereof, and may be configured to prevent diffusion between the switching layer(s) and one or more over or underlying layers of the device. Non-limiting examples of suitable materials that may be used to form such barrier layers include metal nitrides (e.g., TaN, TiN, WN), refractory metal carbides (e.g., TiC, TaC, WC), refractory metal carbonitrides (e.g., TaCN), conductive metal oxides (e.g., $RuO_2$, $CrO_2$, $WO_2$, $IrO_2$ $PtO_2$, $RhO_2$), combinations thereof, and the like.

The properties of TMRE 203 may be tuned in several ways. For example, as noted previously the switching layer(s) of TMRE 203 may be configured to transition from a default (e.g., high resistance) state to a switched (e.g., low resistance) state in response to an applied voltage that is greater than or equal to $V_{TH2}$. With that in mind, the value of $V_{TH2}$ may be tuned by adjusting the thickness of the switching layer(s) in TMRE 203. For example, in some instances $V_{TH2}$ may decrease as the thickness of the switching layer(s) in TMRE 203 decrease, and vice versa.

It may therefore be desirable to adjust the thickness of the switching layer(s) of TMRE 203 to attain a desired $V_{TH2}$. In that regard, in some embodiments the thickness of the switching layer(s) of TMRE 203 may be adjusted such that that $V_{TH2}$ ranges from greater than 0 to about 0.5V, such as from about 0.1 to about 0.4 V, or even about 0.2 to about 0.3V. Of course such values and ranges are enumerated for the sake of example only, and any suitable $V_{TH2}$ may be used.

The resistance of TMRE 203 in its high resistance (e.g., OFF) state may also be impacted by the thickness of the switchable layer(s) used therein. For example in some embodiments the high resistance of TMRE 203 in its high resistance state in some embodiments may decrease as the thickness of the switchable layer(s) used therein decreases, and vice versa. Although possible, in many instances the resistance of TMRE 203 in its low resistance state may not be impacted by the thickness of the switching layer(s) used therein. Rather in many instances, the resistance of TMRE 203 in its low resistance state may depend on the choice of material(s) used in its switching layer(s) and potentially other considerations.

It may therefore be desirable to adjust the thickness of the switching layer(s) of TMRE 203 such that TMRE exhibits a desired resistance in is high resistance state. In that regard, in some embodiments the thickness of the switching layer(s) of TMRE 203 may be adjusted such that that resistance of TMRE 203 in its high resistance state is consistent with the above noted values of $R_{H2}$, and the resistance of TMRE 203 in its low resistance state is consistent with the above noted values of $R_{L2}$. In any case, the thickness of the switching layer(s) in TMRE 203 may vary widely, and may range, for example, from greater than equal to 0 to about 40 nanometers (such), such as from about 5 to about 30 nm, or even about 5 to about 20 nm.

Figure 3:
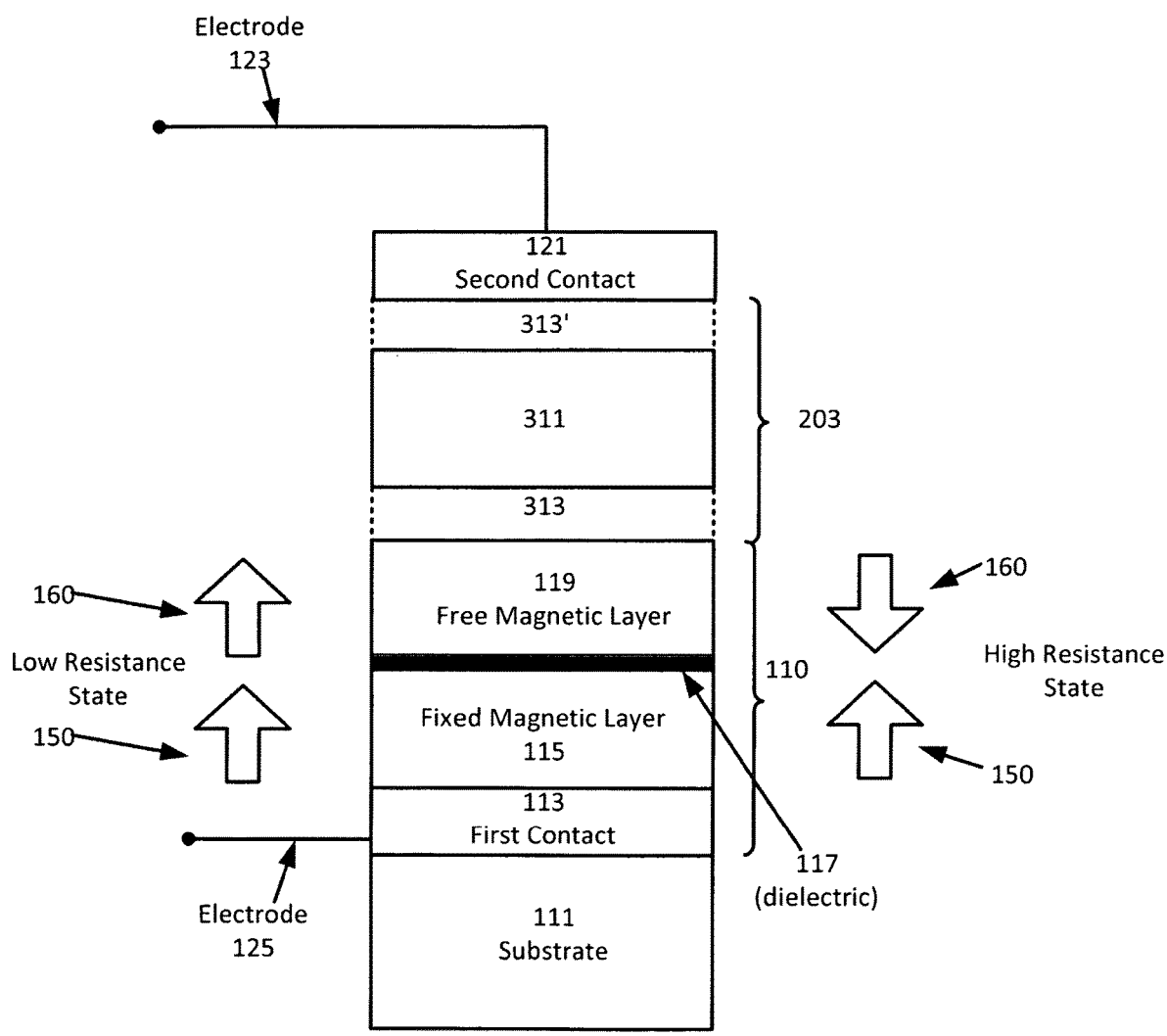
FIG. 3 illustrates a cross sectional view of one example of combined MTJ element and TMRE element consistent with the present disclosure.

Reference is now made to FIG. 3, which depicts one example of a combination 201' of a TMRE 203 and a MTJ 103 consistent with the present disclosure. More particularly, FIG. 3 depicts a combination 201' in which TMRE 203 and MTJ 103 are part of the same layer stack, i.e., in which TMRE 203 and MTJ 103 are part of the same monolithic structure. As can be seen, combination 201' includes substrate 111, material stack 110 and second contact 121, the nature and function of which are generally the same as described previous in connection with FIG. 1B. Therefore in the interest of brevity such elements are not described again here. With that in mind, combination 201' further illustrates that TMRE 203 in this embodiment is a material stack that is formed on material stack 110 of MTJ 103. It should be understood that the position of the layer(s) of TMRE 203 on (e.g., directly on) free magnetic layer 119 are illustrative only, and that the layer(s) of TMRE 203 may be positioned differently. For example, the layer(s) of TMRE 203 may be formed under fixed magnetic layer 115, e.g., between fixed magnetic layer 115 and first contact 113.

In the illustrated embodiment, TMRE 203 includes switching layer 311, and optionally includes one or more barrier (e.g., diffusion barrier) layers 313, 313'. For example and as shown in the illustrated embodiment, TMRE 203 may include a barrier layer 313 between a lower surface of switching layer 311 and an upper surface of free magnetic layer 319. Alternatively or additionally, in some embodiments TMRE 203 includes a barrier layer 313' that is formed on (e.g., directly on) an upper surface of switching layer 311, e.g., between an upper surface of switching layer 311 and second contact 121. The nature and function of switching layer 311 and barrier layers 313, 313' have been previous described, and so are not reiterated.

As further shown in the embodiment of FIG. 3, contact 121 may be formed on (e.g., directly on) an upper surface of switching layer 311, and/or on an upper surface of optional barrier layer 313'. Consistent with the description of FIG. 1B, contact 121 may function to couple combination 201' to one or more additional components, such as transistor 105, a source of voltage, or a combination thereof. Without limitation, in some embodiments contact 113 couples combination 201' to transistor 105, which in turn may be coupled to a source of voltage.

Returning now to FIG. 2, as further shown memory cell 200 includes a transistor 105 coupled to a combination 201 of MTJ 103 and TMRE 203, such that memory cell has a 1T-1MTJ-1TMRE structure. The operation of memory cell 200 is the same as a 1T-1MTJ cell, which is well understood in the art and is therefore is only briefly summarized herein. Consistent with the previous description of the function of transistor 105 in FIG. 1A, transistor(s) 105 in FIGS. 2 and 4 generally function as a switch to enable the selection of one memory cell 200 from an array of memory cells 200n. For example, transistor 105 may be coupled to a word line (not shown in FIG. 2 but shown in FIG. 4), which may control whether transistor 105 is in an ON or an OFF state. In its OFF state, transistor 105 may prevent the application of a voltage (e.g., $V_0$ in FIG. 2) to memory cell 200.

For example when the state of MTJ 103 is to be changed (e.g., during a write operation) or read (e.g., during a read operation), the word line may cause transistor 105 to transition to an ON state, thereby allowing voltage $V_0$ to be applied to cell 200. During a write operation, $V_0$ may exceed $V_{TH1}$ of MTJ 103, causing it to transition from its current state to a switched state. In contrast during a read operation, a $V_0$ less than $V_{TH1}$ may be applied to cell 200, in which case MTJ 103 may remain in its current state. In either case, the resistance state of MTJ 103 may be determined, e.g., with sense circuitry which may sense the magnitude of a current passing through cell 100. When MTJ 103 is in its high resistance state, the sensed current may be relatively small, whereas when MTJ 103 is in its low resistance state, the sensed current may be relatively high.

Figure 4:
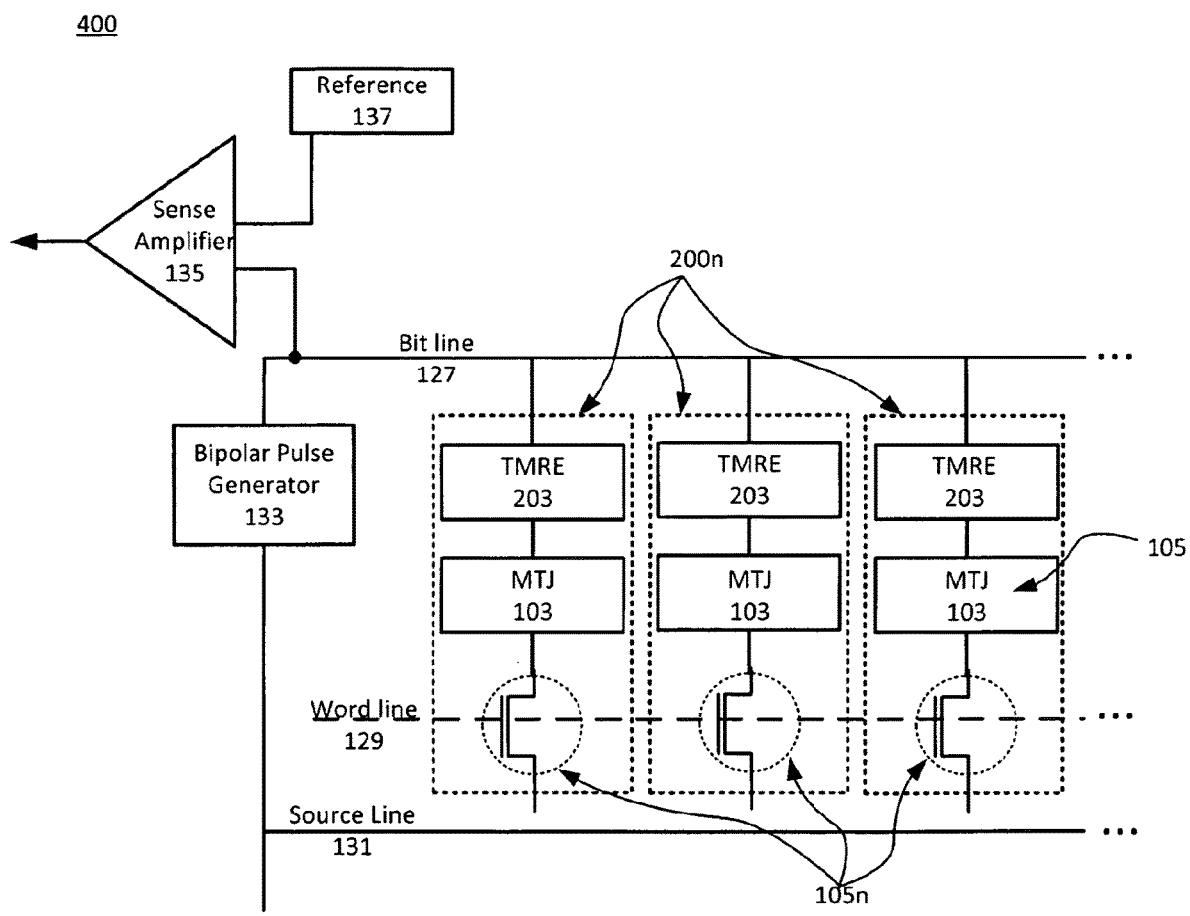
FIG. 4 is a block diagram of one example of a memory device including an array of 1T-1J-1TMRE memory cells, consistent with the present disclosure.

The foregoing concepts may be applied to produce a memory device that includes an array of memory cells 200. In that regard reference is made to FIG. 4, which depicts one example of a memory device 400 including a plurality of 1T-1MTJ-1TMRE memory cells consistent with the present disclosure. More specifically, the embodiment of FIG. 4 depicts memory device 400 as including a plurality (e.g, an array) of memory cells 200$_n$, wherein n is a positive integer greater than or equal to 2 and each memory cell thereof is configured in the manner previously described. As further shown, memory device includes bit line 127, word line 129, source line 131 (which may also be understood as a sense line), a bipolar pulse generator 133, a sense amplifier 135, and a reference 137. Bit line 127 and source line 131 are each coupled to a plurality of memory cells 200$_n$, In some embodiments bit line 127 may be coupled to a contact proximate the free magnetic layer in the MTJs of cells 200$_n$, e.g., to second contact 121 of material stack 110 shown in FIG. 3. In such instances source line 131 may be coupled to a contact proximate the fixed magnetic layer in the MTJs of cells 200$_n$, e.g., to first contact 113 of material stack 110 in FIG. 3. Of course such configuration is not required, and other suitable configurations may be used. For example, in some embodiments the position of MTJs 103 and TMREs 203 may be reversed. Likewise the position of the free and fixed magnetic layers in MTJs 103 may also be switched. In any case, one or more word line(s) 129 may be coupled to transistors 105 in each of memory cells 200$_n$.

The operation of memory device 400 is generally the same as the operation of memory device 150 discussed above, and therefore is not reiterated in detail here. Generally, a memory controller or other component may transmit a cell select or other signal via one or more word lines 129 to select one memory cell 200 from the plurality of memory cells 200$n$, e.g., in connection with a read or a write operation. The cell select signal may cause a selected transistor 105 to turn ON, while other transistors 105 remain in their off state. A voltage may then be applied between bit line 127 and source line 131 (or vice versa), in connection with a read operation, write operation, or the like.

In the case of a read operation, a memory controller may cause bipolar pulse generator 133 to generate a pulse with a read voltage ($V_R$) that is less than the switching voltage ($V_{TH1}$) of the MTJ 103 of a selected cell. $V_R$ may be applied across selected cell 200 via bit line 127 and source line 130. When $V_R$ is applied, a voltage drop Vd1 will occur across MTJ 103. The magnitude of Vd1 will depend on the state of MTJ 103. That is, when MTJ 103 is in its high resistance state, Vd1 will be relatively large, whereas when MTJ 103 is in its low resistance state, Vd1 will be relatively small. Depending on the magnitude of Vd1, the voltage (generally equal to $V_R$–Vt–Vd1) applied to TMRE may or may not exceed $V_{TH2}$. As may therefore be appreciated, whether or not TMRE 203 will be driven from its default (e.g., high resistance) state to its switched (e.g., low resistance) state may depend on the magnitude of $V_R$ and the resistance state of MTJ 103.

As previously discussed, MTJ 103 and TMRE 203 may be configured such that when MTJ 103 is in its high resistance state, the voltage applied to TMRE 203 will be less than $V_{TH2}$, whereas when MTJ 103 is in its low resistance state, the voltage applied to TMRE 203 will meet or exceed $V_{TH2}$. Put in other terms, MTJ 103 and TMRE 203 may be configured such that when MTJ 103 is in its high resistance state, TMRE 203 remains in its default (e.g., high resistance) state in response to application of $V_R$ to a selected cell 200, whereas when MTJ 103 is in its low resistance state, TMRE 203 is driven to its switched state in response to the application of $V_R$ to the cell 200.

Each of cells 200$n$ may therefore exhibit a collective TMR, i.e., TMR$_C$ that exceeds the intrinsic TMR, i.e, TMR$_I$ of MTJ 103 alone, as previous discussed. As may be appreciated, this increase in TMR may cause a corresponding increase in the difference between a sensed current ($I_1$) flowing through a selected cell in response to a read pulse when MTJ 103 (and TMRE 203) is in its low resistance state, and a sensed current ($I_2$) flowing through the selected cell in response to a read pulse when MTJ 103 (and TMRE 203) is in its high resistance state.

In the case of a write operation, a memory controller may cause bipolar pulse generator 133 to generate a pulse with a write voltage ($V_W$) that is greater than the switching voltage ($V_{TH1}$) of the MTJ 103 of a selected cell. $V_W$ may be applied across selected cell 200 via bit line 127 and source line 130. When $V_W$ is applied, a voltage drop Vd1 will occur across MTJ 103, and will change from a first value to a second value upon successful completion of the write (i.e., successful switching of the state of MTJ 103). Regardless of the state of MTJ 103, the magnitude of $V_W$ may be selected such that the voltage applied to TMRE 203 will exceed switching voltage $V_{TH2}$. Therefore regardless of the state of MTJ 103, during a read operation TMRE 203 may always be driven to its switched (e.g., low resistance) state.

Figure 6:
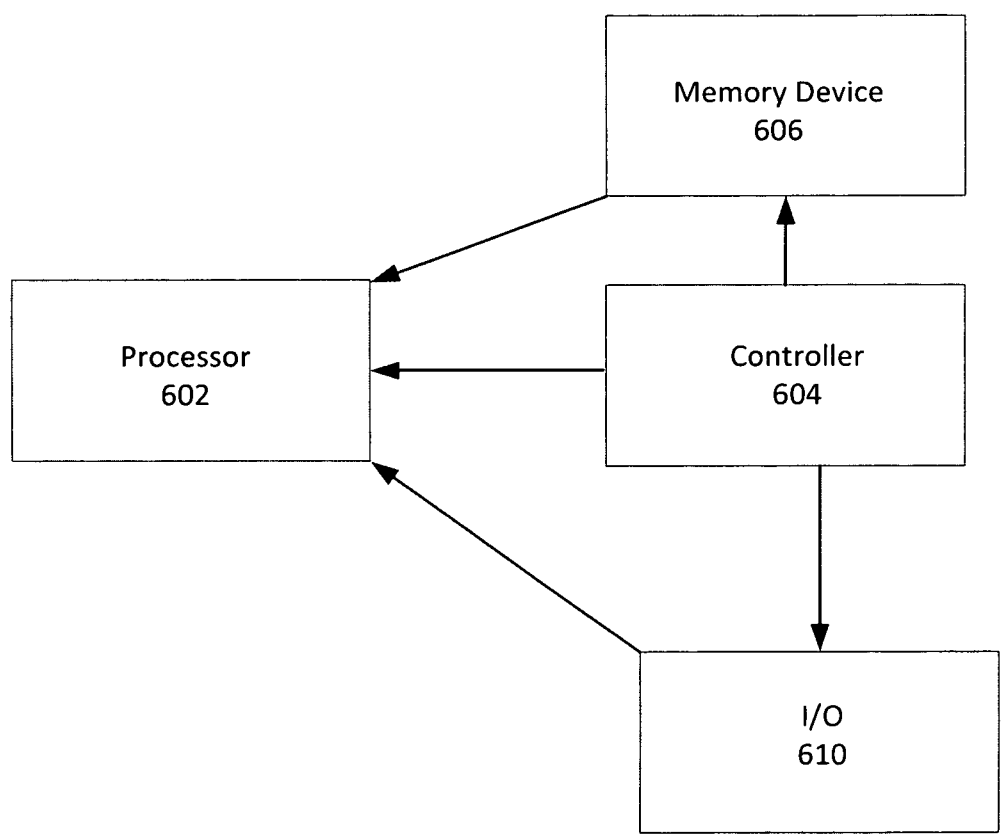
FIG. 6 is a block diagram of one example of an electronic system consistent with embodiments of the present disclosure.

Another aspect of the present disclosure relates to systems that include a memory device including one or more memory cells consistent with the present disclosure. In that regard reference is made to FIG. 6, which is a block diagram of an electronic system 600 in accordance with embodiments of the present disclosure. Electronic system 600 may correspond to, for example, a portable system, a computer system, a process control system, or any other system that uses a processor and associated memory. Electronic system 600 may include, for example, a processor 602, a controller 604, a memory device 606, and an input/output device (I/O) 610. While system 600 is depicted in FIG. 6 with limited components, it should be understood that it may include a plurality of processors, memory devices, controllers, I/O's and other elements that may be found in integrated circuits. In some embodiments, system 600 may be configured to execute instructions which define operations which are to be performed on data by processor 602, as well as other transactions between processor 602, memory device 606, controller 604, and/or I/O 610.

In general, controller 604 may function to coordinate the operations of processor 602, memory device 606, and I/O 610 by cycling through a set of operations that cause instructions to be retrieved from memory device 606 and executed. In this regard, memory device 606 may include a plurality of memory elements consistent with the foregoing description, i.e., a plurality of 1T-1MTJ-1TMRE memory cells. In some instances the MTJ in such cells may be an STTM, such as a perpendicular or in-plane STTM. Alternatively or additionally, 1T-1MTJ-1TMRE memory cells and/or devices including such cells may be embedded in processor 602, controller 604, and/or I/O 610, e.g., as local memory thereof.

Figure 7:
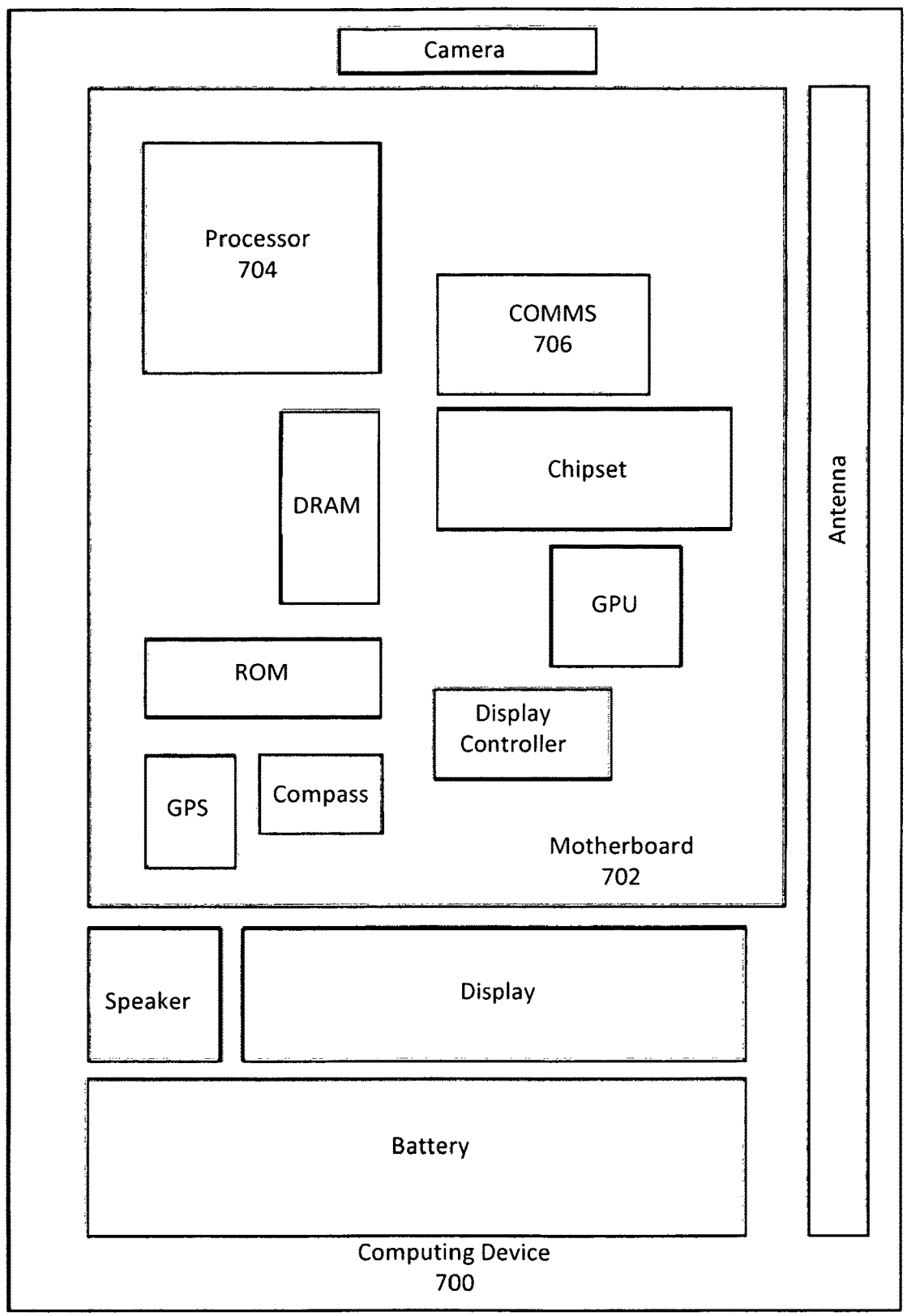
FIG. 7 is a block diagram of a computing device consistent with embodiments of the present disclosure.

Another aspect of the present disclosure relates to a computing device including memory cells consistent with the present disclosure. In that regard reference is made to FIG. 7, which illustrates a computing device 700 in accordance with various embodiments of the present disclosure.

As shown, computing device 700 includes motherboard 702, which may include various components such as but not limited a processor 704, communications circuitry (COMMS) 706, any or all of which may be physically and electronically coupled with motherboard 702.

Depending on its application, computing device 700 may also include other components, such as but not limited to volatile memory (e.g.. DRAM), non-volatile memory (e.g., ROM), flash memory, a graphics processor, a digital signal processor, a crypto processor, a chipset, an antenna, a display, a touchscreen controller, a battery, various codecs, various sensors (e.g., a global positioning system (GPS), accelerometer, gyroscope, etc.), one or more speakers, a camera, and/or a mass storage device.

COMMS 706 may be configured to enable wired or wireless communication for the transfer of data to and from the computing device 700. In some embodiments, COMMS 706 may be configured to enable wireless communications via any of a number of wireless standards or protocols, including but not limited to Wi-Fi (IEEE 802.11 family), WiMAX (IEEE 802.16 family), IEEE 802.20, long term evolution (LTE), EV-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Memory cells/device consistent with the present disclosure may be included in integrated circuit dies that may be present in various components of computing device 700. For example, in some embodiments processor 704 may include an integrated circuit die that includes one or more memory devices, such as one or more 1T-1MTJ-1TMRE cells described herein. Likewise, COMMS 706 may include an integrated circuit die that may include one or more memory cells/devices consistent with the present disclosure. Moreover, various other memories of computing device 700 (e.g., DRAM, ROM, mass storage, etc.) may be made up of or include 1T-1MTJ-1TMRE cells/devices consistent with the present disclosure.

Computing device 700 may be any of a wide variety of computing devices, including but not limited to a laptop computer, a netbook computer, a notebook computer, an ultra book, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder, combinations thereof, and the like. Of course such devices are enumerated for the sake of example only, and computing device 700 may be any suitable type of mobile or stationary electronic device.

As may be appreciated from the foregoing, the technologies described herein may enable the production memory cells and devices with enhanced TMR, relative to the intrinsic TMR of an MTJ element included therein. In that way, the technologies described herein may enable and/or facilitate the production of memory cells that exhibit improved TMR and hence, improved properties for use in memory devices.

EXAMPLES

The following examples represent additional non-limiting embodiments of the present disclosure.

Example 1

According to this example there is provided a memory cell, including: a transistor; a magnetoresistive tunnel junction (MTJ) element; and a tunneling magnetoresistance enhancement element (TMRE) coupled in series with the MTJ element.

Example 2

This example includes any or all of the features of example 1, wherein the transistor is coupled in series with at least one of the MTJ element and the TMRE.

Example 3

This example includes any or all of the features of example 2, wherein: the MTJ element exhibits an intrinsic tunneling magnetoresistance ratio $TMR_I$; the memory cell exhibits a collective tunneling magnetoresistance ratio, $TMR_c$; and $TMR_c$ is greater than $TMR_I$.

Example 4

This example includes any or all of the features of example 2, wherein the TMRE is a variable resistor.

Example 5

This example includes any or all of the features of example 2, wherein the MTJ element includes a spin transfer torque memory (STTM) element.

Example 6

This example includes any or all of the features of example 5, wherein the MTJ element is a perpendicular STTM element.

Example 7

This example includes any or all of the features of example 2, wherein: the MTJ element exhibits a transition between a first resistance state and a second resistance state in response to a voltage that is greater than or equal to a first switching voltage, $V_{TH1}$; the TMRE exhibits a transition between a default resistance state and a switched resistance state in response to a voltage that is greater than or equal to a second switching voltage, $V_{TH2}$.

Example 8

This example includes any or all of the features of example 7, wherein: the first and second resistance states are a first low resistance state and a first high resistance state, respectively; the default and switched states are a second high resistance and a second low resistance state, respectively; and the MTJ element and the TMRE are configured such that when the MTJ element is in its first resistance state the TMRE is in its switched state, and when the MTJ element is in its second resistance state, the TMRE is in its default state.

Example 9

This example includes any or all of the features of example 8, wherein in response to a read voltage applied to the cell: the MTJ element remains in a current resistance state; and the current resistance state is one of the first resistance state and the second resistance state.

Example 10

This example includes any or all of the features of example 2, wherein the MTJ element is defined by a first layer stack and the TMRE is defined by a second layer stack.

Example 11

This example includes any or all of the features of example 10, wherein the first and second layer stacks are combined, with the first layer stack formed above or below the second layer stack.

Example 12

This example includes any or all of the features of example 10, wherein the first layer stack includes a fixed magnetic layer, a free magnetic layer, and a dielectric layer between the free magnetic layer and the fixed magnetic layer.

Example 13

This example includes any or all of the features of example 10, wherein the second layer stack includes at least one layer of a material exhibiting a metal to insulator transition.

Example 14

This example includes any or all of the features of example 13, wherein the at least one layer of a material exhibiting a metal to insulator transition includes a MOTT insulator.

Example 15

This example includes any or all of the features of example 11, wherein: the first layer stack includes a fixed magnetic layer, a free magnetic layer, and a dielectric layer between the free magnetic layer and the fixed magnetic layer; and the second layer stack includes at least one layer of a material exhibiting a metal to insulator transition.

Example 16

This example includes any or all of the features of example 15, further including a barrier layer between the first layer stack and the second layer stack.

Example 17

This example includes any or all of the features of example 11, wherein the transistor is formed above or below the first layer stack or the second layer stack.

Example 18

This example includes any or all of the features of example 3, wherein TMRc is greater than or equal to about 200.

Example 19

According to this example there is provided a memory device, including: a memory controller; and a plurality of memory cells; wherein each of the plurality of memory cells includes: a transistor; a magnetoresistive tunnel junction (MTJ) element; and a tunneling magnetoresistance enhancement element (TMRE) coupled in series with the MTJ element.

Example 20

This example includes any or all of the features of example 19, wherein the transistor is coupled in series with at least one of the MTJ element and the TMRE.

Example 21

This example includes any or all of the features of example 20, wherein: each MTJ element of the plurality of memory cells exhibits an intrinsic tunneling magnetoresistance ratio $TMR_I$; each memory cell of the plurality of memory cells exhibits a collective tunneling magnetoresistance ratio, $TMR_c$; and $TMR_c$ is greater than $TMR_I$.

Example 22

This example includes any or all of the features of example 20, wherein each TMRE in the plurality of memory cells is a variable resistor.

Example 23

This example includes any or all of the features of example 20, wherein each MTJ element in the plurality of memory cells includes a spin transfer torque memory (STTM) element.

Example 24

This example includes any or all of the features of example 23, wherein each MTJ element in the plurality of memory cells is a perpendicular STTM element.

Example 25

This example includes any or all of the features of example 20, wherein: each MTJ element in the plurality of memory cells exhibits a transition between a first resistance state and a second resistance state in response to a voltage that is greater than or equal to a first switching voltage, $V_{TH1}$; each TMRE in the plurality of memory cells exhibits a transition between a default resistance state and a switched resistance state in response to a voltage that is greater than or equal to a second switching voltage, $V_{TH2}$.

Example 26

This example includes any or all of the features of example 25, wherein: the first and second resistance states are a first low resistance state and a first high resistance state, respectively; the default and switched states are a second high resistance and a second low resistance state, respectively; and each memory cell of the plurality of memory cells is configured such that when an MTJ element thereof is in its first resistance state, the TMRE thereof is in its switched state, and when the MTJ element thereof is in its second resistance state, the TMRE thereof is in its default state.

Example 27

This example includes any or all of the features of example 20, further including at least one word line coupled to each transistor of the plurality of memory cells, wherein the memory controller is configured to select a selected one of the plurality of memory cells for use via the at least one word line.

Example 28

This example includes any or all of the features of example 27, wherein: the memory controller configured to cause the transmission of a cell select signal to a selected transistor of the plurality of transistors via the at least one word line; the cell select signal is configured to cause the selected transistor to transition from an OFF to an ON state, thereby selecting the selected one of the memory cells.

Example 29

This example includes any or all of the features of example 26, further including at least one word line coupled to each transistor of the plurality of memory cells, wherein: the memory controller is configured to select a selected one of the memory cells for use via the at least one word line.

Example 30

This example includes any or all of the features of example 29, wherein the memory controller is further configured to cause the application of a read voltage, $V_R$, to the selected one of the memory cells, wherein $V_R$ is less than $V_{TH1}$.

Example 31

This example includes any or all of the features of example 30, further including sense circuitry to sense a sensed current flow through the selected one of the memory cells in response to $V_R$, wherein the memory controller is to determine a resistance state of the MTJ element of the selected one of the memory cells at least in part from the sensed current flow.

Example 32

This example includes any or all of the features of example 29, wherein the memory controller is further configured to cause the application a write voltage, $V_w$, to the selected one of the memory cells, wherein $V_w$ is greater than or equal to $V_{TH1}$.

Example 33

This example includes any or all of the features of example 32, further including sense circuitry to sense a sensed current flow through the select one of the memory cells in response to $V_w$, wherein the memory controller is to determine a resistance state of the MTJ element of the selected one of the memory cells at least in part from the sensed current flow.

Example 34

This example includes any or all of the features of example 19, wherein each MTJ element in the plurality of memory cells is defined by a first layer stack and each TMRE in the plurality of memory cells is defined by a second layer stack.

Example 35

This example includes any or all of the features of example 34, wherein the first and second layer stacks are combined, with the first layer stack formed above or below the second layer stack.

Example 36

This example includes any or all of the features of example 34, wherein the first layer stack includes a fixed magnetic layer, a free magnetic layer, and a dielectric layer between the free magnetic layer and the fixed magnetic layer.

Example 37

This example includes any or all of the features of example 34, wherein the second layer stack includes at least one layer of a material exhibiting a metal to insulator transition.

Example 38

This example includes any or all of the features of example 37, wherein the at least one layer of a material exhibiting a metal to insulator transition includes a MOTT insulator.

Example 39

This example includes any or all of the features of example 34, wherein: the first layer stack includes a fixed magnetic layer, a free magnetic layer, and a dielectric layer between the free magnetic layer and the fixed magnetic layer; and the second layer stack includes at least one layer of a material exhibiting a metal to insulator transition.

Example 40

This example includes any or all of the features of example 38, further including a barrier layer between the first layer stack and the second layer stack.

Example 41

This example includes any or all of the features of example 21, wherein the $TMR_c$ of each of the plurality of memory cells is greater than or equal to about 200.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A memory cell, comprising:
   a transistor;
   a magnetoresistive tunnel junction (MTJ) element;
   a tunneling magnetoresistance enhancement element (TMRE) coupled in series with the MTJ element; and
   wherein:
   the transistor is coupled in series with at least one of the MTJ element and the TMRE;
   the MTJ element exhibits a transition between a first resistance state and a second resistance state in response to a voltage that is greater than or equal to a first switching voltage, $V_{TH1}$;
   the TMRE exhibits a transition between a default resistance state and a switched resistance state in response to a voltage that is greater than or equal to a second switching voltage, $V_{TH2}$;
   the first and second resistance states are a first low resistance state and a first high resistance state, respectively;
   the default and switched states are a second high resistance and a second low resistance state, respectively; and
   the MTJ element and the TMRE are configured such that when the MTJ element is in its first resistance state the TMRE is in its switched state, and when the MTJ element is in its second resistance state, the TMRE is in its default state.

2. The memory cell of claim 1, wherein:
   the MTJ element exhibits an intrinsic tunneling magnetoresistance ratio $TMR_I$;
   the memory cell exhibits a collective tunneling magnetoresistance ratio, $TMR_c$;

$TMR_c = (CRH - CRL)/CRL$;

CRL is a collective low resistance of the memory cell when the MTJ is in a low resistance state and the TMRE is in a low resistance state
   CRH is a collective high resistance of the memory cell when the MTJ is in a high resistance state and the TMRE is in a high resistance state; and
   $TMR_c$ is greater than $TMR_I$.

3. The memory cell of claim 1, wherein the TMRE is a variable resistor.

4. The memory cell of claim 1, wherein in response to a read voltage applied to the cell:
   the MTJ element remains in a current resistance state; and
   the current resistance state is one of the first resistance state and the second resistance state.

5. The memory cell of claim 1, wherein:
   the MTJ element is defined by a first layer stack;
   the TMRE is defined by a second layer stack; and
   the first and second layer stacks are combined.

6. The memory cell of claim 5, wherein:
   the second layer stack comprises at least one layer of a material exhibiting a metal to insulator transition, said at least one layer of a material exhibiting a metal to insulator transition comprising a MOTT insulator.

7. The memory cell of claim 5, wherein:
   the first layer stack comprises a fixed magnetic layer, a free magnetic layer, and a dielectric layer between the free magnetic layer and the fixed magnetic layer; and
   the second layer stack comprises at least one layer of a material exhibiting a metal to insulator transition.

8. The memory cell of claim 6, wherein said transistor is formed above or below the first layer stack or the second layer stack.

9. The memory cell of claim 2, wherein $TMR_c$ is greater than or equal to about 200.

10. A memory device, comprising:
    a memory controller; and
    a plurality of memory cells;
    wherein each of said plurality of memory cells comprises:
    a transistor;
    a magnetoresistive tunnel junction (MTJ) element;
    a tunneling magnetoresistance enhancement element (TMRE) coupled in series with the MTJ element; and
    the transistor is coupled in series with at least one of the MTJ element and the TMRE; and
    wherein:
    each MTJ element in said plurality of memory cells exhibits a transition between a first resistance state and a second resistance state in response to a voltage that is greater than or equal to a first switching voltage, $V_{TH1}$;
    each TMRE in said plurality of memory cells exhibits a transition between a default resistance state and a switched resistance state in response to a voltage that is greater than or equal to a second switching voltage, $V_{TH2}$;
    the first and second resistance states are a first low resistance state and a first high resistance state, respectively;
    the default and switched states are a second high resistance and a second low resistance state, respectively; and
    each memory cell of said plurality of memory cells is configured such that when an MTJ element thereof is in its first resistance state, the TMRE thereof is in its switched state, and when the MTJ element thereof is in its second resistance state, the TMRE thereof is in its default state.

11. The memory device of claim 10, wherein:
    each MTJ element of said plurality of memory cells exhibits an intrinsic tunneling magnetoresistance ratio $TMR_I$;
    each memory cell of said plurality of memory cells exhibits a collective tunneling magnetoresistance ratio, $TMR_c$;

$TMR_c = (CRH - CRL)/CRL$;

CRL is a collective low resistance of the plurality of memory cells when the MTJ and TMRE of each of the plurality of memory cells is in a respective low resistance state
    CRH is a collective high resistance of the plurality memory cells when the MTJ and TMRE of each of the plurality of memory cells is in a respective high resistance state;
    and
    $TMR_c$ is greater than $TMR_I$.

12. The memory device of claim 11, wherein each TMRE in said plurality of memory cells is a variable resistor.

13. The memory device of claim 11, further comprising at least one word line coupled to each transistor of said plurality of memory cells, wherein said memory controller is configured to select a selected one of said plurality of memory cells for use via said at least one word line.

14. The memory device of claim 13, wherein:
    said memory controller configured to cause the transmission of a cell select signal to a selected transistor of said plurality of transistors via said at least one word line;
    said cell select signal is configured to cause said selected transistor to transition from an OFF to an ON state, thereby selecting the selected one of said memory cells.

15. The memory device of claim 10, further comprising at least one word line coupled to each transistor of said plurality of memory cells, wherein:

said memory controller is configured to select a selected one of said memory cells for use via said at least one word line.

16. The memory device of claim 15, wherein said memory controller is further configured to cause the application of a read voltage, $V_R$, to the selected one of said memory cells, wherein $V_R$ is less than $V_{TH1}$.

17. The memory device of claim 16, further comprising sense circuitry to sense a sensed current flow through the selected one of said memory cells in response to $V_R$, wherein the memory controller is to determine a resistance state of the MTJ element of the selected one of said memory cells at least in part from said sensed current flow.

18. The memory device of claim 16, wherein said memory controller is further configured to cause the application a write voltage, $V_w$, to the selected one of said memory cells, wherein $V_w$ is greater than or equal to $V_{TH1}$.

19. The memory device of claim 18, further comprising sense circuitry to sense a sensed current flow through the select one of said memory cells in response to $V_W$, wherein the memory controller is to determine a resistance state of the MTJ element of the selected one of said memory cells at least in part from said sensed current flow.

20. The memory device of claim 10, wherein:

each MTJ element in said plurality of memory cells is defined by a first layer stack;

each TMRE in said plurality of memory cells is defined by a second layer stack; and the first and second layer stacks in each memory cell are combined.

21. The memory device of claim 11, wherein the $TMR_c$ of each of said plurality of memory cells is greater than or equal to about 200.

* * * * *